(12) United States Patent
Choi et al.

(10) Patent No.: US 12,238,879 B2
(45) Date of Patent: Feb. 25, 2025

(54) ROLLABLE DISPLAY DEVICE

(71) Applicant: Samsung Display Co., Ltd., Yongin-si (KR)

(72) Inventors: Jin Hwan Choi, Seoul (KR); Beomjin Kim, Asan-si (KR); Jiyeon Kim, Hwaseong-si (KR); Tae Woong Kim, Seongnam-si (KR); Tae-Ho Kim, Hwaseong-si (KR); Jaeho Ahn, Asan-si (KR); Sangjun Lee, Hwaseong-si (KR); Jonghwa Lee, Hwaseong-si (KR); Dongwon Choi, Seoul (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 204 days.

(21) Appl. No.: 17/957,395

(22) Filed: Sep. 30, 2022

(65) Prior Publication Data
US 2023/0209741 A1    Jun. 29, 2023

(30) Foreign Application Priority Data

Dec. 29, 2021    (KR) .................. 10-2021-0191810

(51) Int. Cl.
*H05K 5/02* (2006.01)
*B32B 3/08* (2006.01)
(Continued)

(52) U.S. Cl.
CPC ............ *H05K 5/0217* (2013.01); *B32B 3/08* (2013.01); *G06F 1/1652* (2013.01); *B32B 7/12* (2013.01); *B32B 17/10* (2013.01); *B32B 27/08* (2013.01); *B32B 27/281* (2013.01); *B32B 27/34* (2013.01); *B32B 27/36* (2013.01); *B32B 27/365* (2013.01); *B32B 2255/10* (2013.01);
(Continued)

(58) Field of Classification Search
CPC ........ G06F 1/1652; G06F 1/16; G06F 1/1641; B32B 3/08; G09F 9/301
See application file for complete search history.

(56) References Cited

U.S. PATENT DOCUMENTS

| 9,019,696 B2 | 4/2015 | Hamers et al. |
| 9,940,892 B2 | 4/2018 | Pang |

(Continued)

FOREIGN PATENT DOCUMENTS

| JP | 6698920 B2 | 5/2020 |
| KR | 101512873 B1 | 4/2015 |

*Primary Examiner* — James Wu
*Assistant Examiner* — Dakota M Talbert
(74) *Attorney, Agent, or Firm* — CANTOR COLBURN LLP

(57) ABSTRACT

A display module including a display unit and a support member disposed below the display unit and including first areas and second areas. The support member includes a matrix, a first supporter disposed in the matrix and including first extension parts, each extending in a first direction and spaced apart from each other in a second direction crossing the first direction, and a second supporter disposed in the matrix and including second extension parts, each extending in the first direction and spaced apart from each other in the second direction, and connection parts disposed between the second extension parts, where the second extension parts and the connection parts define openings in the second supporter.

20 Claims, 19 Drawing Sheets

(51) Int. Cl.
*G06F 1/16* (2006.01)
*H10K 59/12* (2023.01)
*B32B 7/12* (2006.01)
*B32B 17/10* (2006.01)
*B32B 27/08* (2006.01)
*B32B 27/28* (2006.01)
*B32B 27/34* (2006.01)
*B32B 27/36* (2006.01)

(52) U.S. Cl.
CPC ..... *B32B 2307/732* (2013.01); *B32B 2457/20* (2013.01); *G06F 1/1641* (2013.01); *H10K 59/12* (2023.02)

(56) References Cited

U.S. PATENT DOCUMENTS

| | | | |
|---|---|---|---|
| 10,963,014 B1* | 3/2021 | Park | H04B 1/3827 |
| 11,013,130 B2* | 5/2021 | Shin | G09F 9/301 |
| 2021/0029840 A1* | 1/2021 | Kwon | G06F 1/1652 |
| 2022/0317732 A1* | 10/2022 | Lee | G06F 1/1641 |

* cited by examiner

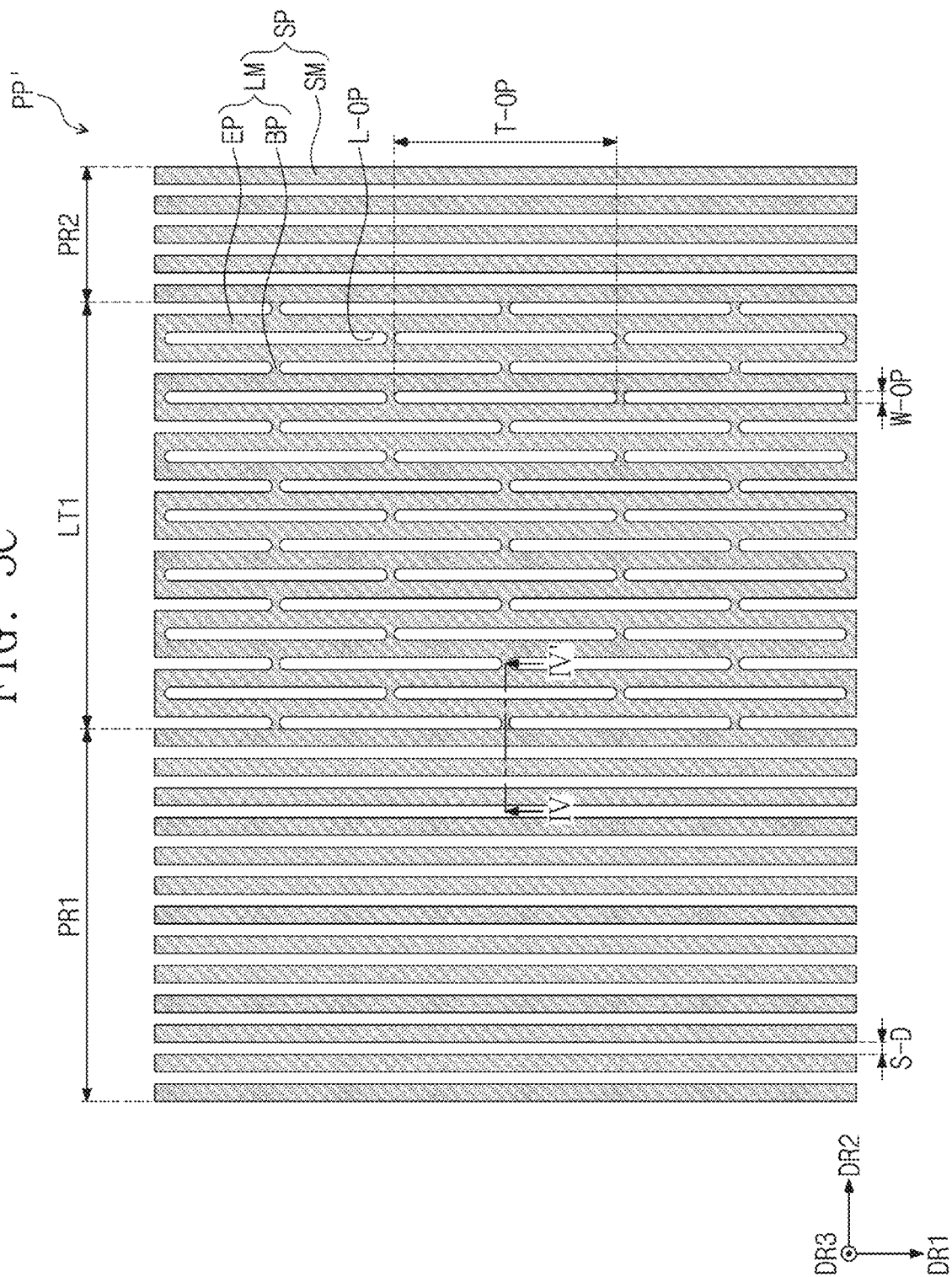

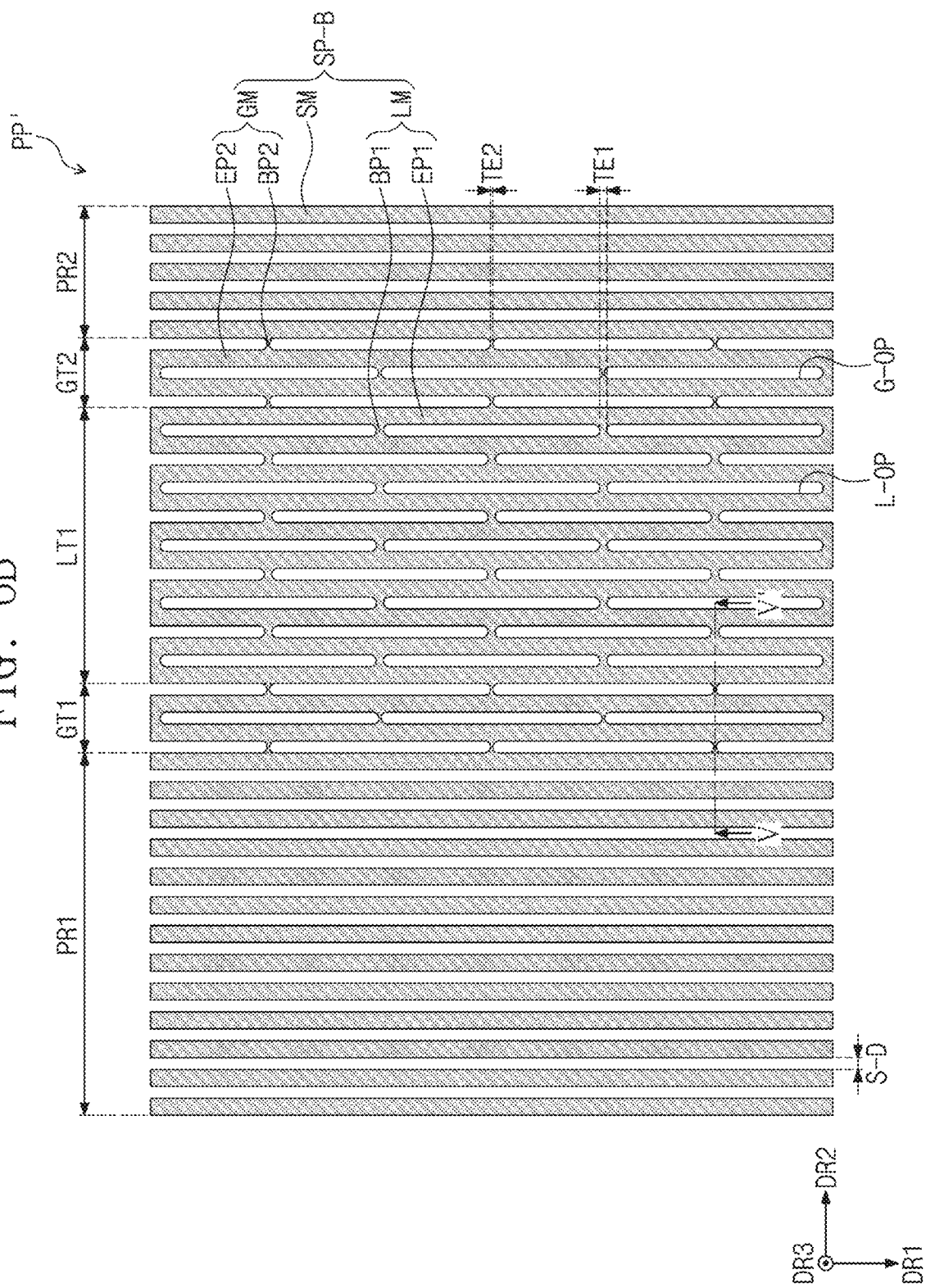

ROLLABLE DISPLAY DEVICE

This application claims priority to Korean Patent Application No. 10-2021-0191810, filed on Dec. 29, 2021, and all the benefits accruing therefrom under 35 U.S.C. § 119, the content of which in its entirety is herein incorporated by reference.

BACKGROUND

1. Field

The disclosure herein relates to a rollable display device.

2. Description of the Related Art

A display device that provides an image to a user, e.g., a smartphone, a digital camera, a laptop computer, a navigation unit, and a smart television, may include a display module for displaying the image. The display module may generate an image to provide the generated image to the user through a display screen.

In recent years, as technologies of the display device are developed, various types of display device have been developed. For example, various flexible display devices that are deformable, foldable, and rollable into a curved shape have been developed. The flexible display devices may be easily carried and improve user's convenience.

SUMMARY

The disclosure provides a display device having an improved rollable property.

An embodiment of the invention provides a display module including: a display unit which displays an image; and a support member disposed below the display unit, where the supporter member includes 1st to n-th first areas spaced apart from each other and 1st to n-th second areas alternately disposed with the 1st to n-th first areas. In such an embodiment, the support member includes: a matrix; a first supporter disposed in the matrix and including first extension parts, each extending in a first direction and spaced apart from each other in a second direction crossing the first direction; and a second supporter disposed in the matrix and including second extension parts, each extending in the first direction and spaced apart from each other in the second direction, and connection parts disposed between the second extension parts, where the second extension parts and the connection parts define openings in the second supporter. In such an embodiment, the first supporter overlaps each of the 1st to n-th first areas, the second supporter overlaps each of the 1st to n-th second areas, where n is a natural number.

In an embodiment, each of the 1st to n-th first areas may have a width in the second direction, which gradually increases from the 1st first area to the n-th first area.

In an embodiment, the connection parts disposed between a i-th second extension part and a (i+1)-th second extension part among the connection parts may be shifted with the connection parts disposed between the (i+1)-th second extension part and a (i+2)-th second extension part in the first direction, where i may be a natural number.

In an embodiment, the support member may further include an additional supporter disposed in the matrix between a i-th first area and a i-th second area or between the i-th second area and a (i+1)-th first area among the 1st to n-th first areas and the 1st to n-th second areas, and the additional supporter may include additional extension parts, each extending in the first direction and spaced apart from each other in the second direction, and additional connection parts disposed between the additional extension parts, where the additional extension parts and the additional connection parts define additional openings in the additional supporter.

In an embodiment, a number of the connection parts disposed between a i-th second extension part and a (i+1)-th second extension part among the connection parts may be greater than a number of the additional connection parts disposed between a i-th additional extension part and a (i+1)-th additional extension part among the additional connection parts.

In an embodiment, the additional supporter may have a thickness less than a thickness of each of the first supporter and the second supporter.

In an embodiment, each of the additional connection parts may have a width in the first direction less than a width in the first direction of each of the connection parts.

In an embodiment, each of the openings may have a width of about 0.5 millimeter (mm) or more to about 2.0 mm or less in the first direction, and each of the openings may have a width of about 0.1 mm or more to about 0.5 mm or less in the second direction.

In an embodiment, each of the first supporter and the second supporter may have a line width of about 0.5 mm or more to about 2.0 mm or less.

In an embodiment, a distance between centers of the first extension parts adjacent to each other in the second direction among the first extension parts may be about 0.5 mm or more to about 2.0 mm or less.

In an embodiment, the matrix may have a thickness of about 0.5 mm or more to about 2.0 mm or less, and each of the first supporter and the second supporter may have a thickness of about 0.4 mm or more to about 0.8 mm or less.

In an embodiment, the matrix may include an elastomer, and each of the first supporter and the second supporter may include one of stainless steel, aluminum, and carbon fiber reinforced plastic.

In an embodiment, at least a portion of each of the first extension parts and the second extension parts may have a square shape, a rectangular shape, a trapezoidal shape, and a triangular shape on a cross-section.

In an embodiment, each of the display unit and the support member may be rolled around an imaginary axis extending in the first direction.

In an embodiment of the invention, a display device includes: a shaft extending in a first direction; and a display module including a display unit which displays an image, and a support member disposed below the display unit, wherein the support member includes a 1st to n-th first areas spaced apart from each other along a second direction crossing the first direction, and 1st to n-th second areas alternately disposed with the 1st to n-th first areas. In such an embodiment, the support member includes: a matrix; a first supporter including first extension parts disposed in the matrix and spaced apart from each other and; and a second supporter disposed in the matrix where openings are defined in the second supporter. In such an embodiment, the first supporter overlaps each of the 1st to n-th first areas, the second supporter overlaps each of the 1st to n-th second areas, and each of the 1st to n-th second areas overlaps a start point of the 1st first area when the display module is rolled around the shaft, where n is a natural number.

In an embodiment, each of the 1st to n-th first areas may have a width in the second direction, which gradually increases from the 1st first area to the n-th first area.

In an embodiment, the support member may further include an additional supporter disposed in the matrix between a i-th first area and a i-th second area or between the i-th second area and a (i+1)-th first area among the 1st to n-th first areas and the 1st to n-th second areas, and the additional supporter may include additional extension parts, each extending in the first direction and spaced apart from each other in the second direction, and additional connection parts disposed between the additional extension parts, where the additional extension parts and the additional connection parts define additional openings in the additional supporter.

In an embodiment, each of the additional openings may have an area greater than an area of each of the openings in the second supporter.

In an embodiment, a module opening extending in the first direction may be defined in the shaft, one portion of the display module adjacent to the 1st first area may be disposed in the module opening such that the display module is coupled with the shaft, and the display module may be rolled around the shaft based on the start point.

In an embodiment, an adhesive groove, in which an adhesive layer is disposed, may be defined in the shaft, a portion of the display module overlapping the 1st first area may be coupled with the shaft by the adhesive layer, and the display module may be rolled around the shaft based on the start point.

BRIEF DESCRIPTION OF THE DRAWINGS

The above and other features of the invention will become more apparent by describing in further detail embodiments thereof with reference to the accompanying drawings, in which:

FIG. 5C is an enlarged plan view illustrating an area PP' of FIGS. 5A and 5B;

FIG. 6B is a plan view illustrating a support member according to an embodiment of the invention;

DETAILED DESCRIPTION

Figure 1A:
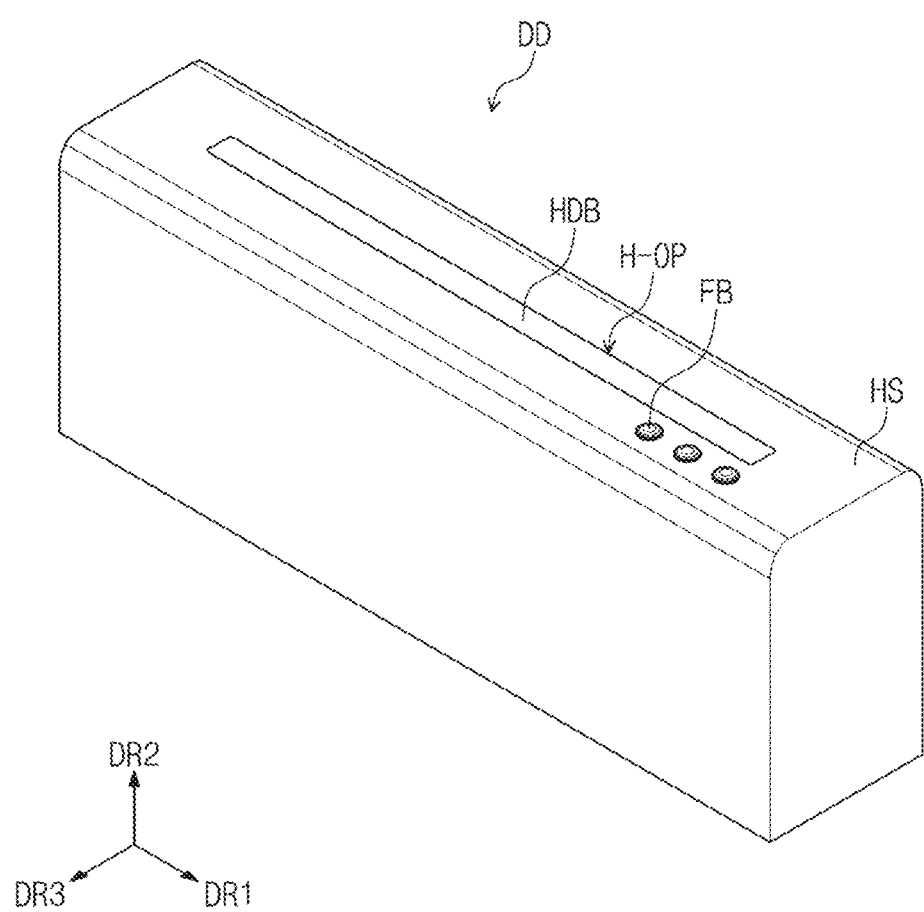
FIG. 1A is a perspective view illustrating a display device in which a display module is stored in a housing according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In this specification, it will be understood that when one component (or region, layer, portion) is referred to as being 'on', 'connected to', or 'coupled to' another component, it can be directly disposed/connected/coupled on/to the one component, or an intervening third component may also be present.

Like reference numerals refer to like elements throughout. Also, in the figures, the thickness, ratio, and dimensions of components are exaggerated for clarity of illustration. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, spatially relative terms, such as "below", "lower", "above", and "upper", may be used herein for ease of description to describe an element and/or a feature's relationship to another element(s) and/or feature(s) as illustrated in the drawings. The terms may be a relative concept and described based on directions expressed in the drawings.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the accompanying drawings.

Figure 1B:
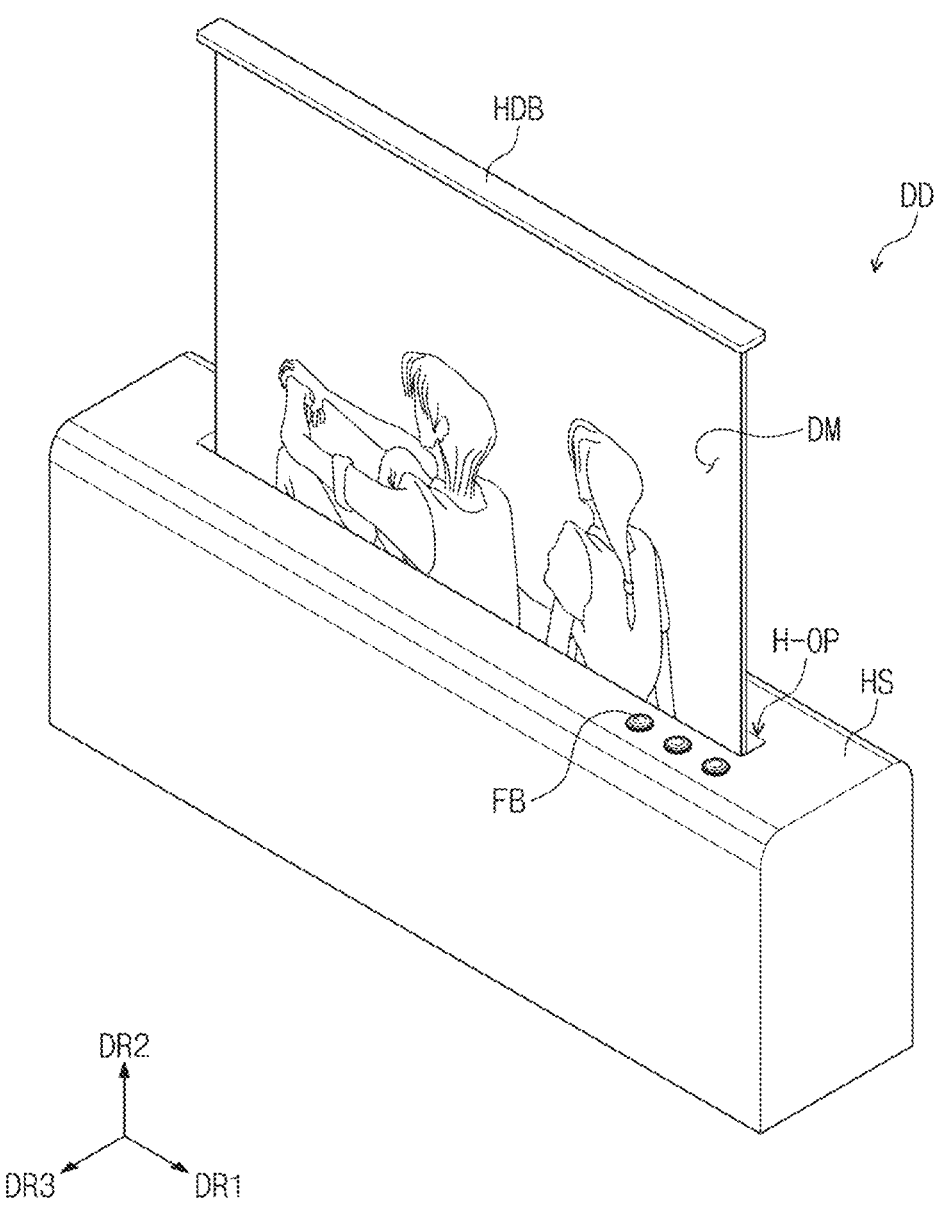
FIG. 1B is a perspective view illustrating the display device in which the display module is rolled according to an embodiment of the invention.
Figure 1C:
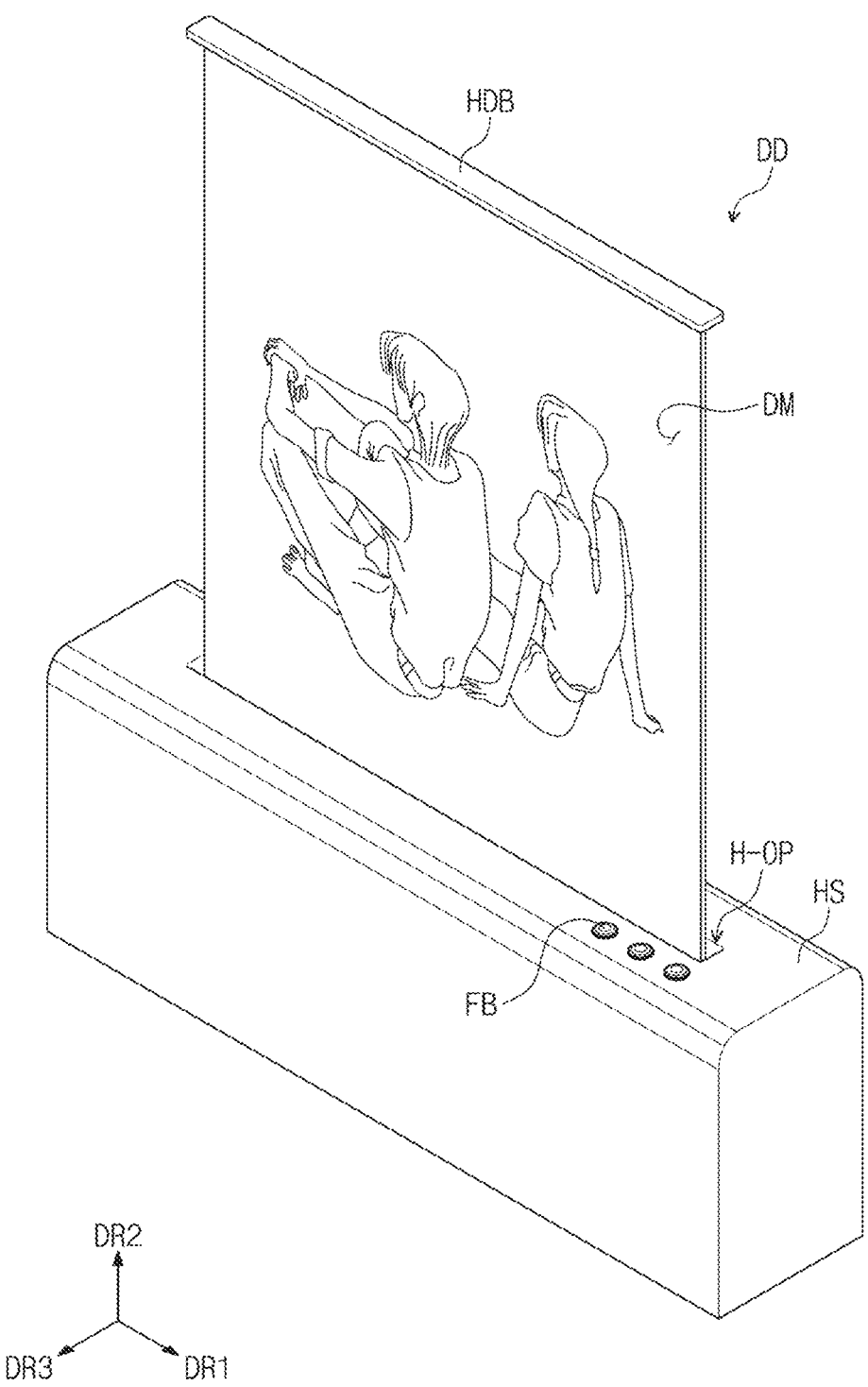
FIG. 1C is a perspective view illustrating the display device in which the display module is exposed to the outside of the housing according to an embodiment of the invention.

FIG. 1A is a perspective view illustrating a display device in which a display module is stored in a housing according to an embodiment of the invention. FIG. 1B is a perspective view illustrating the display device in which the display module is rolled according to an embodiment of the invention. FIG. 1C is a perspective view illustrating the display device in which the display module is exposed to the outside of the housing according to an embodiment of the invention.

Referring to FIGS. 1A to 1C, a display device DD according to an embodiment of the invention may include a housing HS, a head bar HDB, a display module DM, and a plurality of function buttons FB.

The housing HS may extend in a first direction DR1. A housing opening H-OP extending in the first direction DR1 may be defined in the housing HS or through the housing HS in a second direction DR2.

Hereinafter, a direction crossing (e.g., perpendicular to) a plane defined by the first and second directions DR1 and DR2 is defined as a third direction DR3.

The head bar HDB may be disposed in the housing opening H-OP The head bar HDB may move close to or away from the housing HS in the second direction DR2. The head bar HDB may be coupled to the housing opening H-OP to define an outer appearance of the display device DD.

The display module DM may be accommodated in the housing HS. The display module DM may include a display surface on a plane defined by the first direction DR1 and the second direction DR2. The display module DM may have a rectangular shape in which long sides extending in the second direction DR2 and short sides extending in the first direction DR1 are connected to each other. However, the embodiment of the invention is not limited thereto. In an alternative embodiment, for example, the display module DM may have various shapes such as a circular shape or a polygonal shape.

An image generated from the display module DM may be displayed on the display surface of the display module DM and provided to a user. In FIGS. 1B and 1C, a human figure is illustrated as an example of the image.

The function buttons FB may be disposed on a top surface of the housing HS. The function buttons FB may provide various functions to the display device DD. In an embodiment, for example, the display module DM disposed in the housing HS may move out of the housing HS, or the display module DM disposed outside the housing HS may move into the housing HS. In an embodiment, brightness, resolution, and the like of the image displayed by the display module DM may be controlled by the function buttons FB.

In an embodiment, where the display device DD is coupled to or included in a small-sized electronic device such as a mobile phone, the function buttons FB may be omitted, and the display module DM may be inserted into or withdrawn from the housing HS through functional buttons disposed on an outer portion of the electronic device. However, the embodiment of the invention is not limited thereto.

Figure 2A:
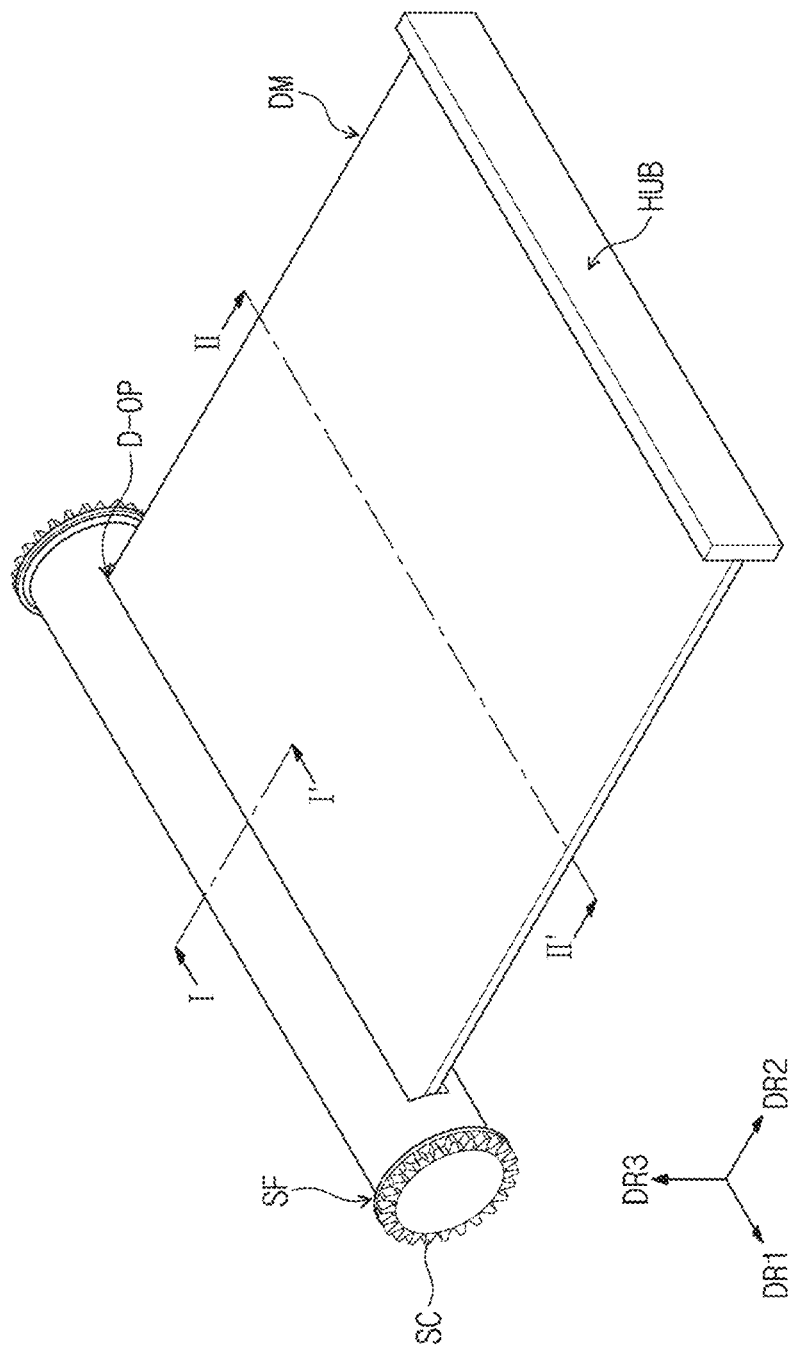
FIG. 2A is a perspective view illustrating a state in which the display module is rolled around a shaft according to an embodiment of the invention.
Figure 2B:
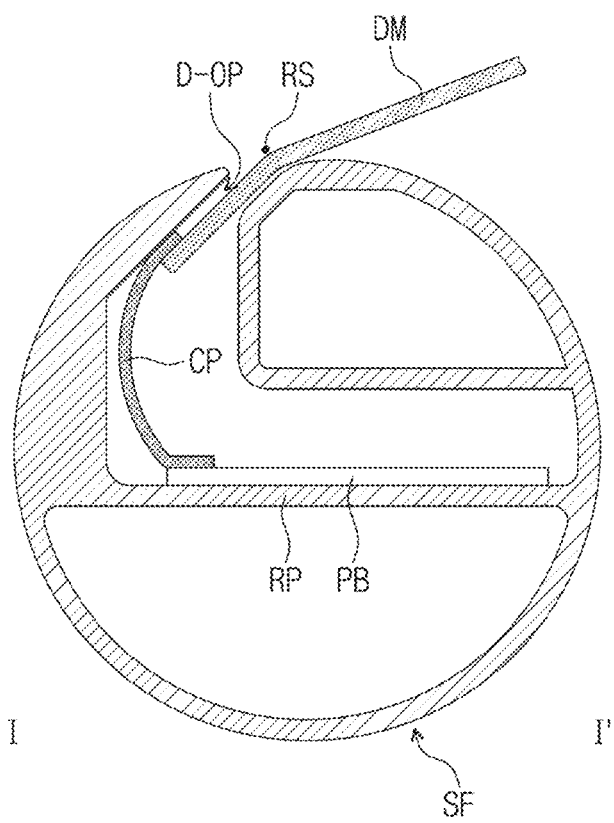
FIG. 2B is a cross-sectional view taken along line I-I' of FIG. 2A.
Figure 2C:
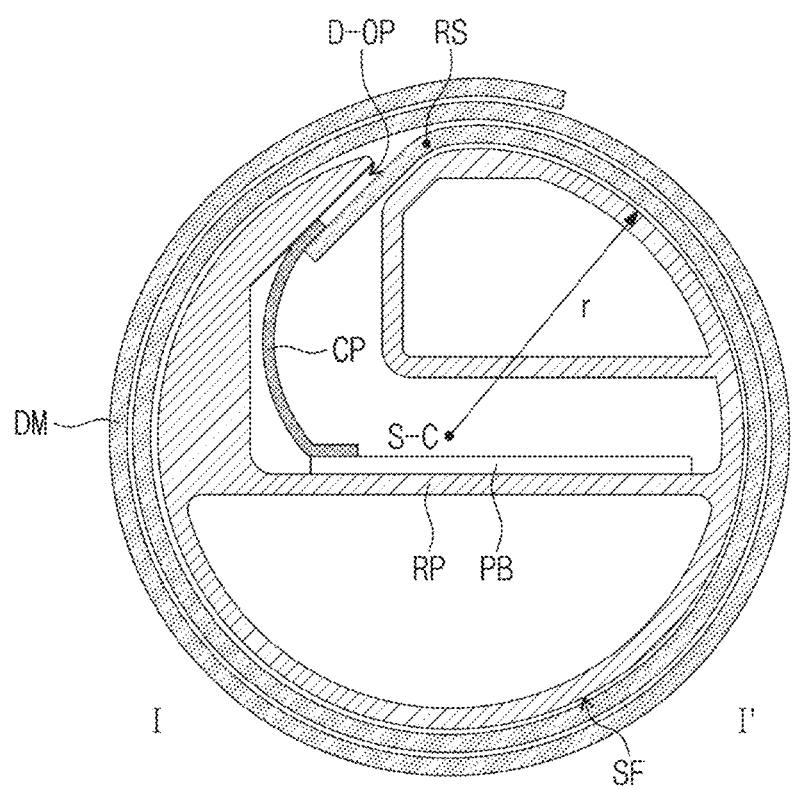
FIG. 2C is a cross-sectional view illustrating the state in which the display module is rolled around the shaft according to an embodiment of the invention.

FIG. 2A is a perspective view illustrating a state in which the display module is rolled around a shaft according to an embodiment of the invention. FIG. 2B is a cross-sectional view taken along line I-I' of FIG. 2A. FIG. 2C is a cross-sectional view illustrating the state in which the display module is rolled around the shaft according to an embodiment of the invention.

Referring to FIG. 2A, the display device DD (refer to FIGS. 1A to 1C) according to an embodiment of the invention may include a shaft SF disposed in the housing HS.

A module opening D-OP extending in the first direction DR1 may be defined in the shaft SF according to an embodiment. One portion of the display module DM may be inserted into the shaft SF through the module opening D-OP.

Deformation of an operation state in which the display module DM is inserted into or withdrawn from the housing HS may be implemented by the shaft SF disposed in the housing HS and a shaft driving unit.

The shaft SF may be connected to the shaft driving unit. The shaft driving unit may provide a rotation power to the shaft SF. The shaft SF may rotate around an imaginary axis extending in the first direction DR1 by the rotation power provided by the shaft driving unit. In an embodiment, the shaft SF may include a motor and a structure such as a gear. In an embodiment, for example, the shaft SF may include a gear SC coupled with a gear of the shaft driving unit. The gear SC having a sawtooth shape may be engaged with the gear of the shaft driving unit and rotate by the rotation power provided by the shaft driving unit. However, the embodiment of the invention is not limited to the configuration of the shaft SF as long as the shaft is coupled with the display module DM and allows the display module DM to rotate.

Referring to FIGS. 2B and 2C, the display device DD may include a flexible circuit board CP connected with the display module DM and a main circuit board PB connected with the flexible circuit board CP. Each of the flexible circuit board CP and the main circuit board PB may be provided in plurality.

A data driver for driving a pixel PX (refer to FIG. 4C) may be manufactured in the form of a circuit chip and mounted on the flexible circuit board CP. The display module DM may further include a data driver for driving the pixel PX, a scan driver SDV (refer to FIG. 4C), and a timing controller for controlling an operation of a light emission driver EDV (refer to FIG. 4C). The timing controller may be manufactured in the form of an integrated circuit chip and mounted on the main circuit board PB. The timing controller may be connected to the data driver, the scan driver SDV, and the light emission driver EDV through the main circuit board PB and the flexible circuit board CP.

According to an embodiment, the flexible circuit board CP may be coupled to one portion of the display module DM disposed in the shaft SF through the module opening D-OP, and the main circuit board PB coupled with the flexible circuit board CP may be coupled to a partition wall RP disposed in the shaft SF.

FIG. 2C is a view illustrating a state in which the display module DM is rolled along the shaft SF. One portion of the display module DM may be disposed in and coupled to the shaft SF, and the rest portion may be rolled along an outer portion of the shaft SF.

In this specification, a point at which the display module DM is rolled with a predetermined curvature may be defined as a 'start point RS'. Also, a distance from a center of the shaft SF to a rear surface of the display module DM contacting the shaft SF may be defined as a radius r.

FIG. 2C illustrates the display module DM that is rolled twice as an example. A stepped portion may be generated at each of points of the display module DM overlapping the start point RS in a state in which the display module DM is rolled around the shaft SF, and accordingly, components overlapping the start point RS among components of the display module DM are deformed, such that a surface quality may be degraded. A description on a support member SP (refer to FIG. 4A) for improving the surface quality degradation of an area overlapping the start point when rolled will be described later.

Figure 3A:
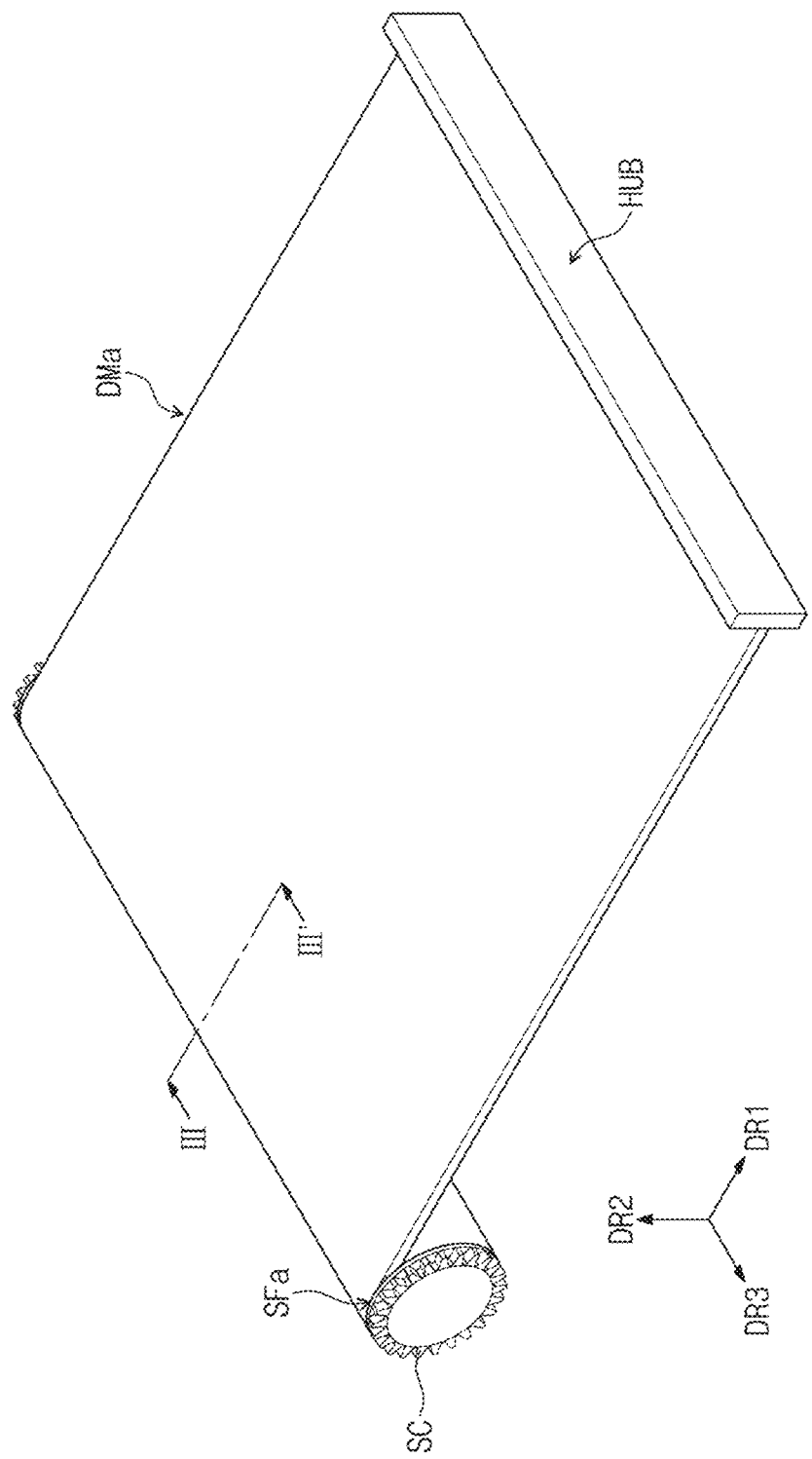
FIG. 3A is a perspective view illustrating a state in which a display module is rolled around a shaft according to an embodiment of the invention.
Figure 3B:
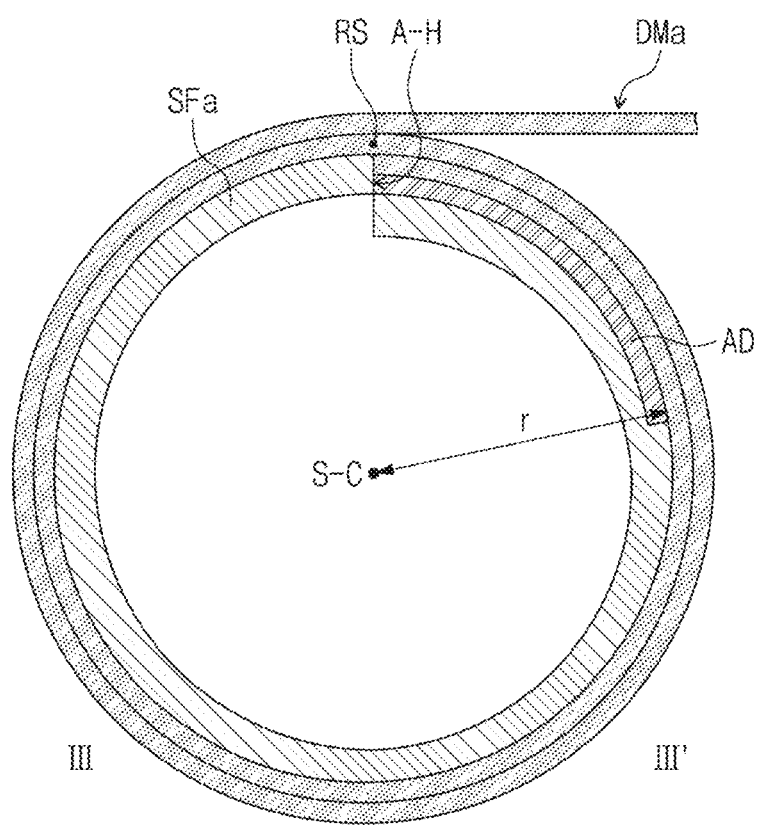
FIG. 3B is a cross-sectional view taken along line of III-III' FIG. 3A.

FIG. 3A is a perspective view illustrating a state in which a display module is rolled around a shaft according to an embodiment of the invention. FIG. 3B is a cross-sectional view taken along line of III-III' FIG. 3A.

Referring to FIGS. 3A and 3B, a display module DMa according to an embodiment may be coupled to an outer portion of a shaft SFa.

A coupling groove A-H, formed by removing a portion of the shaft SFa or defined by a recessed portion of the shaft SFa, may be defined in the shaft SFa, and an adhesive layer AD may be disposed in the coupling groove A-H. The display module DMa may be disposed on the adhesive layer AD disposed in the coupling groove A-H, and the shaft SFa and the display module DMa may be coupled to each other by the adhesive layer AD.

As the coupling groove A-H is generated by removing the shaft SFa as many as a sum of a thickness of the display module DMa and a thickness of the adhesive layer AD, a stepped portion generated due to a thickness of the adhesive layer AD may be maximally reduced. However, as components overlapping the start point RS among components of the display module DMa are deformed, a surface quality may be degraded. A description on the support member SP (refer to FIG. 4A) for improving the surface quality degradation of an area overlapping the start point when rolled will be described later.

Figure 4A:
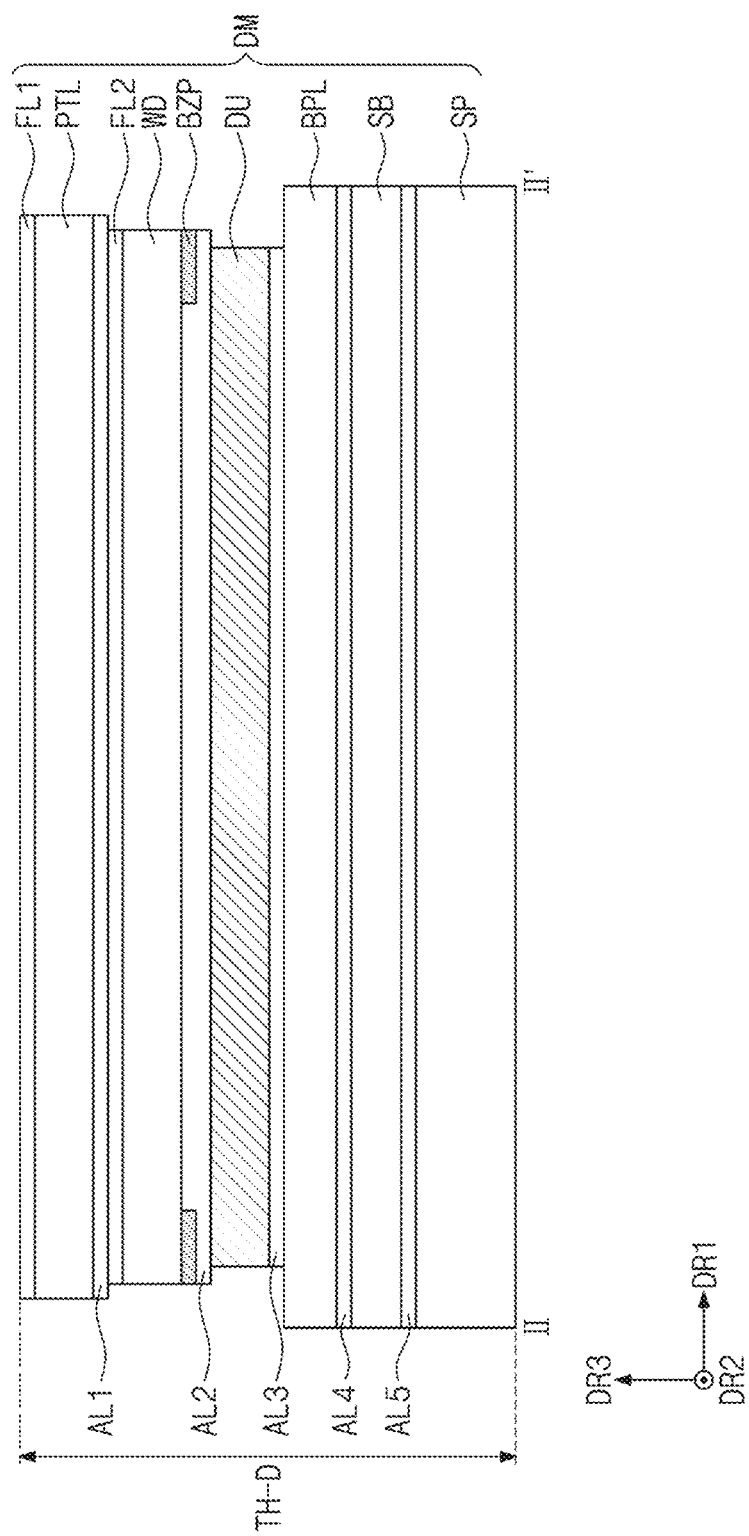
FIG. 4A is a cross-sectional view taken along line II-II' of FIG. 2A.
Figure 4B:
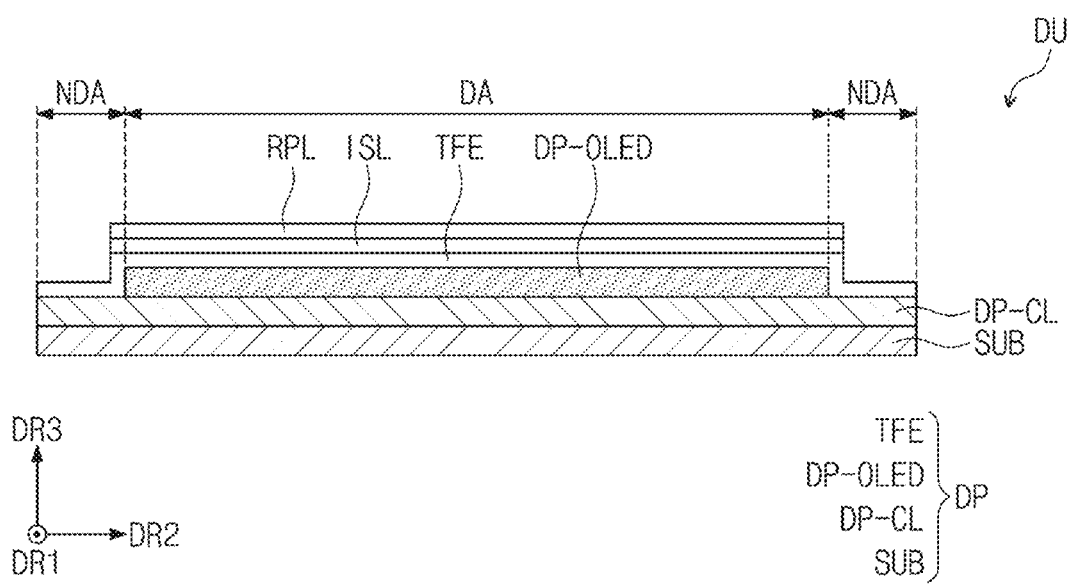
FIG. 4B is a cross-sectional view illustrating a display unit according to an embodiment of the invention.

FIG. 4A is a cross-sectional view taken along line II-IP of FIG. 2A. FIG. 4B is a cross-sectional view illustrating a display unit according to an embodiment of the invention. FIG. 4B is a plan view illustrating a display panel according to an embodiment of the invention.

Referring to FIG. 4A, the display module DM according to an embodiment may include a window protection layer PTL, a thin-film glass substrate WD, functional layers FL1 and FL2, a bezel pattern BZP, a display unit DU, a panel protection layer BPL, a lower layer SB, a support member SP, and adhesive layers AL1 to AL5.

Hereinafter, the adhesive layers AL1 to AL5 to be described may include a pressure sensitive adhesive film (PSA) or an optically clear adhesive (OCA), and any repetitive detailed description thereof will be omitted.

The window protection layer PTL may be disposed on the thin-film glass substrate WD. The window protection layer PTL may protect the thin-film glass substrate WD. The window protection layer PTL may include a synthetic resin film.

The synthetic resin film of the window protection layer PTL may include polyimide, polycarbonate, polyamide, triacetylcellulose, polymethylmethacrylate, or polyethylene terephthalate.

The thin-film glass substrate WD may be disposed below the window protection layer PTL. The thin-film glass substrate WD may be chemically tempered glass. The thin-film glass substrate WD may minimize wrinkle generation when rolling of the display module DM is repeated.

The functional layers FL1 and FL2 may include at least one selected from a hard coating layer, an anti-fingerprint layer, and an anti-reflection layer. A first functional layer FL1 may be disposed on the window protection layer PTL, and a second functional layer FL2 may be disposed on the thin-film glass substrate WD.

A second functional layer FL2 may be coupled with the window protection layer PTL through a first adhesive layer AL1.

The bezel pattern BZP may be disposed on a rear surface of the thin-film glass substrate WD. In an embodiment, the bezel pattern BZP may be disposed on the rear surface of the thin-film glass substrate WD. However, the embodiment of the invention is not limited thereto. In an alternative embodiment, for example, the bezel pattern BZP may be disposed between the window protection layer PTL and the thin-film glass substrate WD. The bezel pattern BZP may be a colored light shielding layer provided by, e.g., a coating method. The bezel pattern BZP may include a base material and a dye or a pigment mixed with the base material. Alternatively, the bezel pattern BZP disposed at one side of the display module DM may be omitted.

The display unit DU may be disposed below the thin-film glass substrate WD. The display unit DU may be coupled with the thin-film glass substrate WD through a second adhesive layer AL2.

Referring to FIG. 4B, an embodiment of the display module DU may include a display panel DP, an input sensor ISL, and an anti-reflection layer RPL.

The display panel DP may include a substrate SUB, a circuit element layer DP-CL disposed on the substrate SUB, a display element layer DP-OLED disposed on the circuit element layer DP-CL, and a thin-film encapsulation layer TFE disposed on the display element layer DP-OLED.

The substrate SUB may include a display area DA and a non-display area NDA disposed around the display area DA. The substrate SUB may include a flexible plastic material such as polyimide. The non-display area NDA may overlap the bezel pattern BZP.

A plurality of transistors and a plurality of insulation layers may be disposed on the circuit element layer DP-CL, and the display element layer DP-OLED may include light emitting elements connected with the transistors.

The thin-film encapsulation layer TFE may cover the display element layer DP-OLED. The thin-film encapsulation layer TFE may include inorganic layers and an organic layer disposed between the inorganic layers. The inorganic layers may protect the pixels from moisture and oxygen. The organic layer may protect the pixels from foreign substances such as dust particles.

Figure 4C:
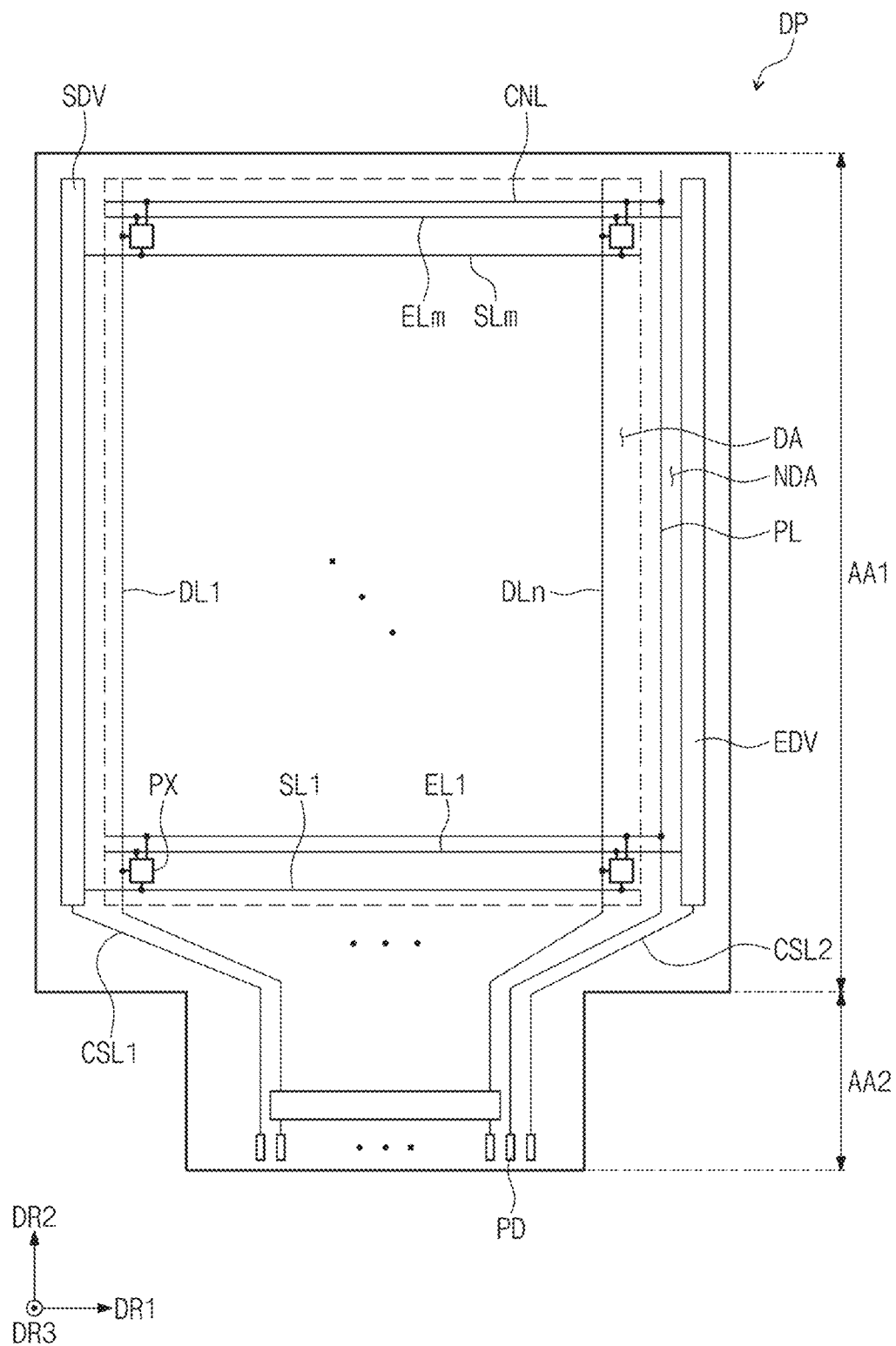
FIG. 4C is a plan view illustrating a display panel according to an embodiment of the invention.

Referring to FIG. 4C, an embodiment of the display panel DP may include the scan driver SDV, the data driver, and the emission driver EDV.

The display panel DP may include a first area AA1 and a second area AA2. The second area AA2 may be a portion of the display panel DP disposed in the shaft SF in the display module DM described above with reference to FIGS. 2B and 2C or an area coupled with the adhesive layer AD in the display module DMa described above with reference to FIG. 3B.

The display panel DP may include a plurality of pixels PX, a plurality of scan lines SL1 to SLm, a plurality of data lines DL1 to DLn, a plurality of light emission lines EL1 to Elm, first and second control lines CSL1 and CSL2, a power line PL, a plurality of connection lines CNL, and a plurality of pads PD. Here, m and n are natural numbers. The pixels PX may be disposed on the display area DA and connected to the scan lines SL1 to SLm, the data lines DL1 to DLn, and the light emission lines EL1 to ELm.

The scan driver SDV and the light emission driver EDV may be disposed on the non-display area NDA. The scan driver SDV and the light emission driver EDV may be spaced apart from each other with the display area DA therebetween in the first direction DR1 on the non-display area NDA. The data driver may be manufactured in the form of an integrated circuit chip and mounted to the flexible circuit board CP described above with reference to FIG. 2B.

The scan lines SL1 to SLm may each extend in the first direction DR1 and be connected to the scan driver SDV. The data lines DL1 to DLn may extend in the second direction D2 and be connected to the data driver. The light emission lines EL1 to ELm may each extend in the first direction DR1 and be connected to the light emission driver EDV.

The data lines DL1 to DLn may be connected to the corresponding pads PD through the data driver. In an embodiment, for example, the data lines DL1 to DLn may be connected to the data driver, and the data driver may be connected to the pads PD that respectively correspond to the data lines DL1 to DLn.

The power line PL, and the connection lines CNL may be connected to the pixels PX.

The first control line CSL1 may be connected to the scan driver SDV, and the second control line CSL2 may be connected to the light emission driver EDV.

The pads PD may be disposed adjacent to a lower end of the second area AA2. The data driver, the power line PL, the first control line CSL1, and the second control line CSL2 may be connected to the pads PD. The pixels PX may be connected to the timing controller and a voltage generation part mounted to the main circuit board PB through the pads PD (refer to FIG. 2B) and the flexible circuit board CP (refer to FIG. 2B).

The timing controller may control an operation of each of the scan driver SDV, the data driver, and the light emission driver EDV. The timing controller may generate a scan control signal, a data control signal, and a light emission control signal in response to control signals received from the outside. The voltage generation part may generate a driving voltage.

The scan control signal may be provided to the scan driver SDV through the first control line CSL1. The light emission control signal may be provided to the light emission driver EDV through the second control line CSL2. The data control signal may be provided to the data driver. The timing controller may receive image signals from the outside and convert a data format of the image signals to match with interface specifications with the data driver, thereby providing the converted image signals to the data driver.

The scan driver SDV may generate a plurality of scan signals in response to the scan control signal. The scan signals may be applied to the pixels PX through the scan lines SL1 to SLm. The scan signals may be sequentially applied to the pixels PX.

The data driver DDV may generate a plurality of data voltages corresponding to the image signals in response to the data control signal. The data voltages may be applied to the pixels PX through the data lines DL1 to DLn. The light emission driver EDV may generate a plurality of light emission signals in response to the light emission control signal. The light emission signals may be applied to the pixels PX through the light emission lines EL1 to ELm.

The pixels PX may receive the data voltages in response to the scan signals. The pixels PX may display an image by emitting light having luminance corresponding to the data voltages in response to the light emission signals. The pixels PX may have a light emission time that is controlled by the light emission signals.

Referring back to FIG. 4B, the input sensor ISL may be disposed on the display panel DP. In an embodiment, the input sensor ISL may be disposed or provided directly on the display panel through a continuous process.

The input sensor ISL may include a plurality of sensing electrodes and a plurality of sensing insulation layers. The input sensor ISL may sense an external input in a self-cap method or a mutual-cap method. The input sensor may sense an input provided by an active-type input device.

The external input may include various types of inputs provided from the outside of the display device DD (refer to FIGS. 1A to 1C). In an embodiment, for example, the external input may include a contact generated by a portion of a user's body such as hands and an external input (e.g., hovering) that is applied by being adjacent to the display device DD or being disposed adjacent by a predetermined distance thereto. In an embodiment, the external input may have various types such as force, pressure, and light. However, the embodiment of the invention is not limited thereto.

The anti-reflection layer RPL may be disposed on the input sensor ISL. The anti-reflection layer RPL may be provided directly on the input sensor ISL or coupled to the input sensor ISL by an adhesive layer. The anti-reflection layer RPL may be defined as an external light reflection preventing film. The anti-reflection layer RPL may reduce a reflectance of external light incident to the display panel DP from the outside.

When the external light traveling toward the display panel DP is reflected by the display panel DP and re-provided to an external user, the user may recognize the external light like a mirror. In an embodiment, the anti-reflection layer RPL may include a plurality of color filters displaying the same color as the pixels PX of the display panel DP to prevent the above-described phenomenon. The color filters may filter the external light into the same color as the pixels PX. In such an embodiment, the external light may not be recognized by the user.

However, the embodiment of the invention is not limited thereto. In an alternative embodiment, for example, the anti-reflection layer RPL may include a polarizing film for reducing the reflectance of the external light. The polarizing film may include a retarder and/or a polarizer.

Referring back to FIG. 4A, the panel protection layer BPL may be disposed below the display unit DU to protect the panel display unit DU. The panel protection layer BPL may be coupled with the display unit DU through a third adhesive layer AL3.

The panel protection layer BPL may include a flexible synthetic resin film. In an embodiment, for example, the panel protection layer BPL may include a flexible plastic material such as polyimide or polyethylene terephthalte. The panel protection layer BPL may further include an antistatic layer and a light shielding layer disposed on at least one selected from a top surface and a rear surface of the panel protection layer BPL.

The lower layer SB may be disposed below the display unit DU. The lower layer SB may be coupled with the panel protection layer BPL through a fourth adhesive layer AL4. The lower layer SB may reduce a stress applied to a lower portion of the display unit DU when rolled. The lower layer SB may include a resin. However, the embodiment of the invention is not limited to the lower layer SB as long as the lower layer reduces a stress applied to the display unit DU when rolled.

The support member SP may be disposed below the lower layer SB. The support member SP may be coupled with the lower layer SB through a fifth adhesive layer AL5. The support member SP may be disposed below the display unit DU to supplement a strength of the display unit DU. The support member SP may further include a functional layer disposed on a bottom surface of the support member SP. The functional layer may include at least one selected from a hard coating layer, an anti-fingerprint layer, an antistatic layer, and an anti-reflection layer.

The support member SP may be a functional layer for preventing degradation of the surface quality of the display module DM although the display module DM performs a rolling operation at a plurality of times. The support member SP will be described in greater detail with reference to FIGS. 5A to 5D.

In an embodiment, a thickness TH-D of the display module DM may be defined as a thickness from the bottom surface of the support member SP to a top surface of the first functional layer FL1.

Figure 5A:
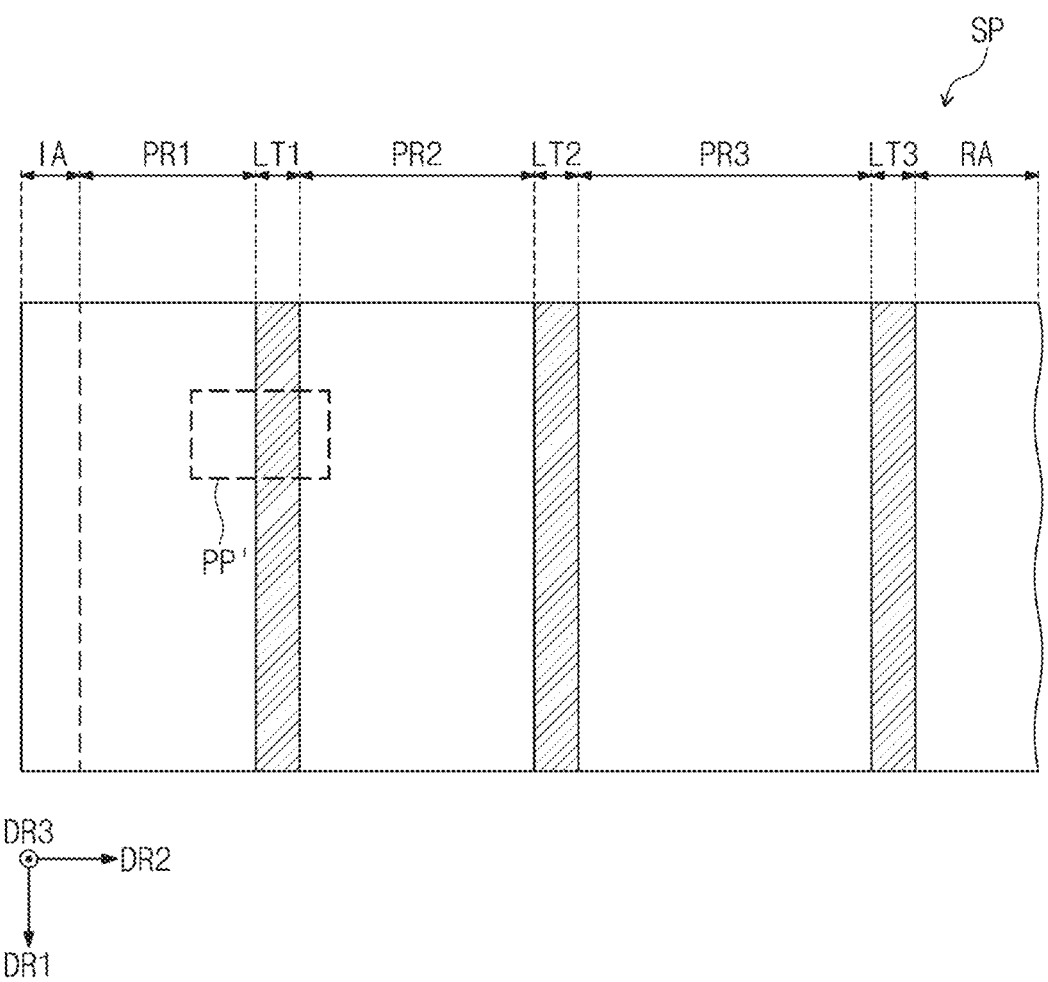
FIG. 5A is a plan view illustrating a support member according to an embodiment of the invention.
Figure 5B:
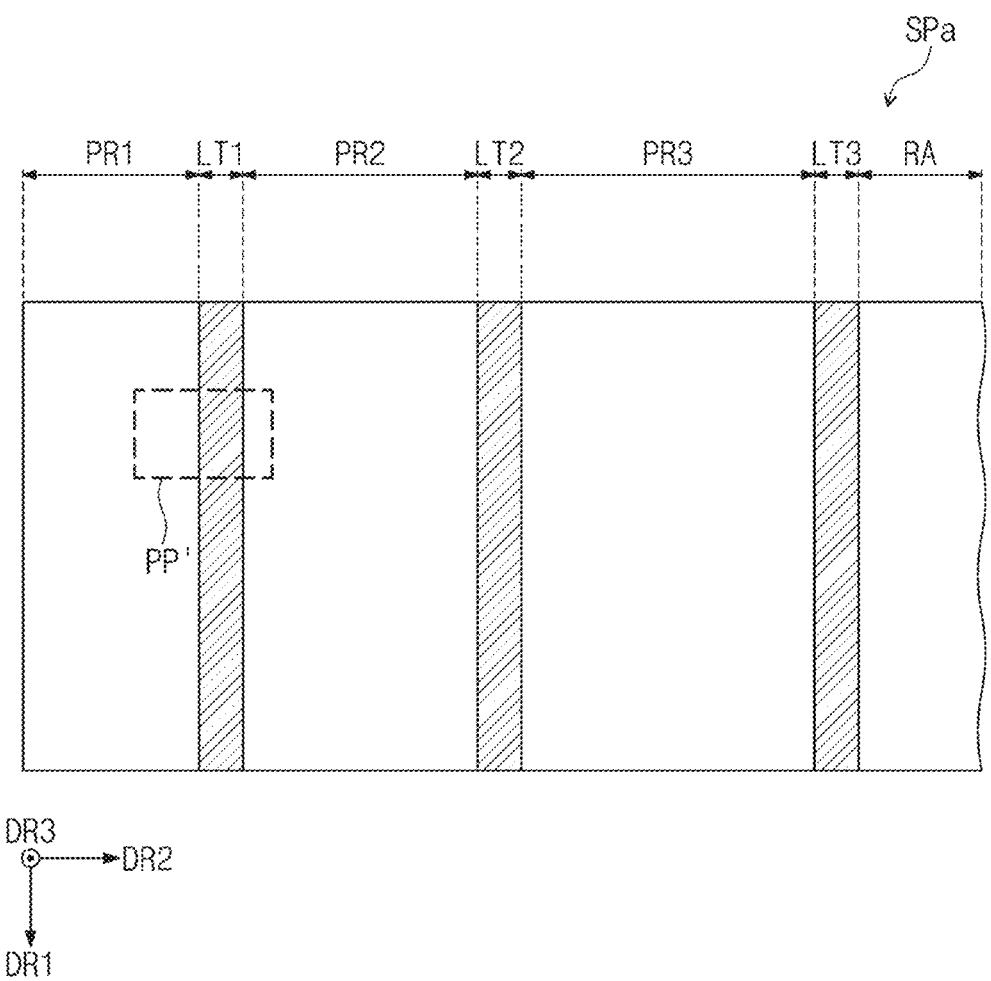
FIG. 5B is a plan view illustrating a support member according to an embodiment of the invention.
Figure 5D:
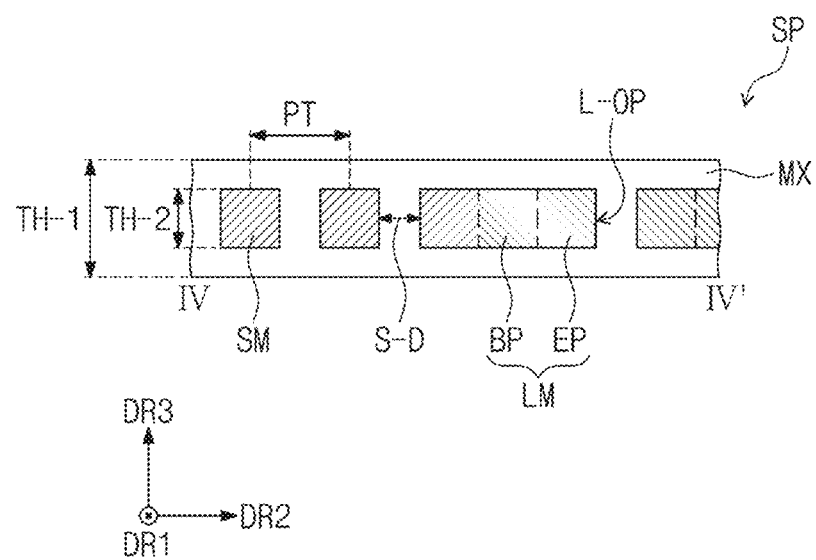
FIG. 5D is a cross-sectional view taken along line IV-IV' of FIG. 5C.

FIG. 5A is a plan view illustrating the support member according to an embodiment of the invention. FIG. 5B is a plan view illustrating a support member according to an embodiment of the invention. FIG. 5C is an enlarged plan view illustrating an area PP' of FIGS. 5A and 5B. FIG. 5D is a cross-sectional view taken along line IV-IV' of FIG. 5C.

Referring to FIG. 5A, the support member SP according to an embodiment may include first areas PR1, PR2, and PR3, each extending in the first direction DR1 and spaced apart from each other in the second direction DR2, and second areas LT1, LT2, and LT3 disposed between the first areas PR1, PR2, and PR3.

Although FIG. 5A shows an embodiment where each of the first areas PR1, PR2, and PR3 and the second areas LT1, LT2, and LT3 includes three areas, the embodiment of the invention is not limited thereto. In an embodiment, for example, the display module DM (refer to FIG. 2A) may include '1st to n-th first areas' and '1st to n-th second areas' according to the number of being rolled around the shaft SF (refer to FIG. 2A). Here, n is a natural number.

The support member SP may include a 1st first area PR1, a 1st second area LT1, a 2nd first area PR2, a 2nd second area LT2, a 3rd first area PR3, and a 3rd second area LT3, which are sequentially arranged in the first direction DR1.

According to an embodiment, the support member SP may further include a coupling area IA extending from one side of the 1st first area PR1 in the first direction DR1. The coupling area IA of the support member SP may be a portion disposed in the shaft SF through the module opening D-OP when the display module DM is rolled by the shaft SF, which is described above with reference to FIGS. 2A to 2C.

In an embodiment, a boundary between the 1st first area PR1 and the coupling area IA may overlap the start point RS described above with reference to FIG. 2C.

The 1st first area PR1 may correspond to an area contacting the shaft SF in the display module DM when the display module DM is rolled around the shaft SF one time.

The 1st second area LT1 may overlap a point overlapping the start point RS in the display module DM when a second rolling of the display module DM around the shaft SF starts.

The 2nd first area PR2 may correspond to an area contacting the display module DM that is rolled one time in the display module DM when the display module DM is rolled around the shaft SF two times.

The 2nd second area LT2 may overlap a point overlapping the start point RS in the display module DM when a third rolling of the display module DM around the shaft SF starts.

The 3rd first area PR3 may correspond to an area contacting the display module DM that is rolled two times in the display module DM when the display module DM is rolled around the shaft SF three times.

The 3rd second area LT3 may overlap a point overlapping the start point RS in the display module DM when a fourth rolling of the display module DM around the shaft SF starts.

According to an embodiment, the support member SP may further include a flat area RA extending from one side of the 3rd second area LT3 in the first direction DR1. The flat area RA of the support member SP may correspond or overlap an area that is not rolled by the shaft SF in the display module DM.

Referring to FIG. 5B, a support member SPa according to an embodiment may include first areas PR1, PR2, and PR3, each extending in the first direction DR1 and spaced apart from each other in the second direction DR2, and second areas LT1, LT2, and LT3 disposed between the first areas PR1, PR2, and PR3.

Although FIG. 5B shows an embodiment where each of the first areas PR1, PR2, and PR3 and the second areas LT1, LT2, and LT3 includes three areas, the embodiment of the invention is not limited thereto. In an embodiment, for example, the display module DMa (refer to FIG. 3A) may include '1st to n-th first areas' and '1st to n-th (second areas' according to the number of being rolled around the shaft SF (refer to FIG. 3A).

The support member SPa may include a 1st first area PR1, a 1st second area LT1, a 2nd first area PR2, a 2nd second area LT2, a 3rd first area PR3, and a 3rd second area LT3, which are sequentially arranged in the first direction DR1.

One portion of the 1st first area PR1 may be a portion coupled with the adhesive layer AD when the display module DM is coupled to the shaft SFa, which is described above with reference to FIGS. 3A and 3B. Thus, the start point RS described above with reference to FIG. 3B may correspond to a start point of the 1st first area PR1.

The 1st first area PR1 may correspond to an area contacting the shaft SFa in the display module DMa when the display module DMa is rolled around the shaft one time.

The 1st second area LT1 may overlap a point overlapping the start point RS in the display module DMa when a second rolling of the display module DMa around the shaft SFa starts.

The 2nd first area PR2 may correspond to an area contacting the display module DMa that is rolled one time in the display module DMa when the display module DMa is rolled around the shaft SFa two times.

The 2nd second area LT2 may overlap a point overlapping the start point RS in the display module DMa when a third rolling of the display module DMa around the shaft SFa starts.

The 3rd first area PR3 may correspond to an area contacting the display module DMa that is rolled two times in the display module DMa when the display module DMa is rolled around the shaft SFa three times.

The 3rd second area LT3 may overlap a point overlapping the start point RS in the display module DMa when a fourth rolling of the display module DMa around the shaft SFa starts.

Thus, a width in the second direction DR2 of the first areas PR1, PR2, and PR3 may gradually increase from the 1st first area PR1 to the 3rd first area PR3. In an embodiment, for example, as illustrated in FIGS. 2C and 3B, when a distance from the center S-C of the shaft SF and SFa to a portion of the display module DM and DMa contacting the shaft SF and SFa is defined as a radius r, a width in the second direction DR2 of the 1st first area PR1 is 2πr, a width in the second direction DR2 of the 2nd first area PR2 is (2πr+thickness TH-D (refer to FIG. 4A))×1', and a width in the second direction DR2 of the 3rd first area PR3 is (2πr+thickness TH-D (refer to FIG. 4A))×2'.

The second areas LT1, LT2, and LT3 may have a same width as each other or widths that gradually increase from the 1st second area LT1 to the 3rd second area LT3. However, the embodiment of the invention is not limited thereto.

According to an embodiment, the support member SPa may further include a flat area RA extending from one side of the 3rd second area LT3 in the first direction DR1. The flat area RA of the support member SP may overlap an area that is not rolled by the shaft SFa in the display module DMa.

Hereinafter, components of the support member SP of FIG. 5A will be described in detail with reference to FIGS. 5C and 5D. A description on the components of the support member SP to be described with reference to FIGS. 5C and 5D will be equally applied to the support member SPa described above with reference to FIG. 5B.

Referring to FIGS. 5C and 5D, an embodiment of the support member SP may include a matrix MX, a first supporter, and a second supporter. The first supporter and the second supporter may be disposed in (e.g., distributed or dispersed into) the matrix MX. The matrix MX may include an elastomer. Each of the first supporter and the second supporter may include at least one selected from stainless steel, aluminum, and carbon fiber reinforced plastic.

The first supporter may be disposed in the matrix MX. The first supporter may include first extension parts SM that each extend in the first direction DR1 and are spaced apart from each other in the second direction DR2. Thus, a spaced space S-D may be defined between the first extension parts adjacent to each other in the second direction DR2.

The first supporter may overlap each of the first areas PR1, PR2, and PR3 (refer to FIG. 5A). That is, the first extension parts SM may be respectively disposed on the first areas PR1, PR2, and PR3.

The second supporter may be disposed in the matrix MX. The second supporter may include a slit LM in which openings L-OP are defined. The slit LM may include second extension parts EP and connection parts BP. The second extension parts EP may each extend in the first direction DR1 and be spaced apart from each other in the second direction DR2. The connection parts BP may be disposed or connected between the second extension parts EP.

The second supporter may overlap each of the second areas LT1, LT2, and LT3 (refer to FIG. 5A). That is, the second extension parts EP and the connection parts BP may be disposed on each of the second areas LT1, LT2, and LT3.

In such an embodiment, the connection parts BP and the second extension parts EP may define the openings L-OP. In such an embodiment, the connection parts BP may not overlap the connection parts BP adjacent thereto in terms of the second direction DR2.

In an embodiment, for example, where i is a natural number, connection parts disposed between a i-th second extension part and a (i+1)-th second extension part may be shifted with connection parts disposed between the (i+1)-th second extension part and a (i+2)-th second extension part in the first direction DR1.

According to an embodiment, a cross-sectional shape of each of the first supporter and the second supporter may have one of a square shape and a rectangular shape.

According to this embodiment, each of the openings L-OP may have a first width T-OP of about 0.5 millimeter (mm) or more to about 2 mm or less (i.e., in a range of about 0.5 mm to about 2 mm) in the first direction DR1 and a second width W-OP of about 0.1 mm or more to about 0.5 mm or less in the second direction DR2.

The matrix MX may have a thickness TH-1 of about 0.5 mm or more to about 2.0 mm.

Each of the first supporter and the second supporter may have a thickness TH-2 of about 0.4 mm or more to about 0.8 mm Each of the first supporter and the second supporter may have a line width (e.g., a width of each of the first extension parts SM and the second extension parts EP in the second direction DR2) of about 0.5 mm or more to about 2.0 mm or less.

A pitch PT between centers of first extension parts adjacent to each other in the second direction DR2 among the first extension parts SM may be about 0.5 mm or more to about 2.0 mm or less.

According to an embodiment of the invention, the second areas LT1, LT2, and LT3 including the second supporter having the slit LM in which the connected openings L-OP are defined may have a resistance against a stress applied to the support member SP greater than the first areas PR1, PR2, and PR3 including the first extension parts SM spaced apart from each other. Thus, the second areas LT1, LT2, and LT3 may have a greater resistance against deformation than the first areas PR1, PR2, and PR3.

As the second areas LT1, LT2, and LT3 overlap the start point RS when the display module DM and DMa is rolled around the shaft SF and SFa, a stress applied to the display module DM and DMa overlapping the start point RS when rolled may be reduced. Thus, the rollable display device DD (refer to FIGS. 1A to 1C) including the display module DM (refer to FIGS. 1B and 1C) having the improved surface quality may be provided.

Figure 6A:
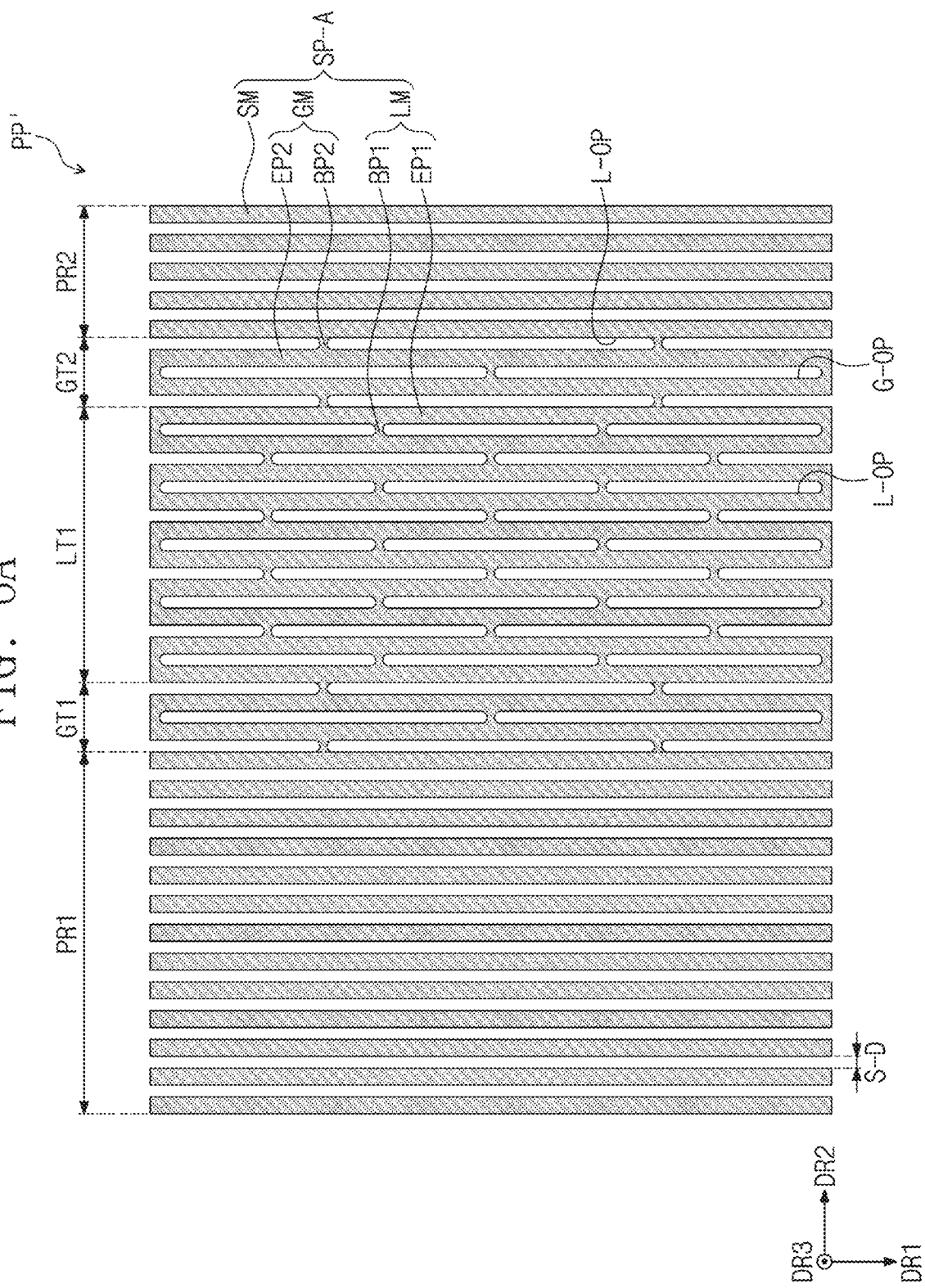
FIG. 6A is a plan view illustrating a support member according to an embodiment of the invention.
Figure 6C:
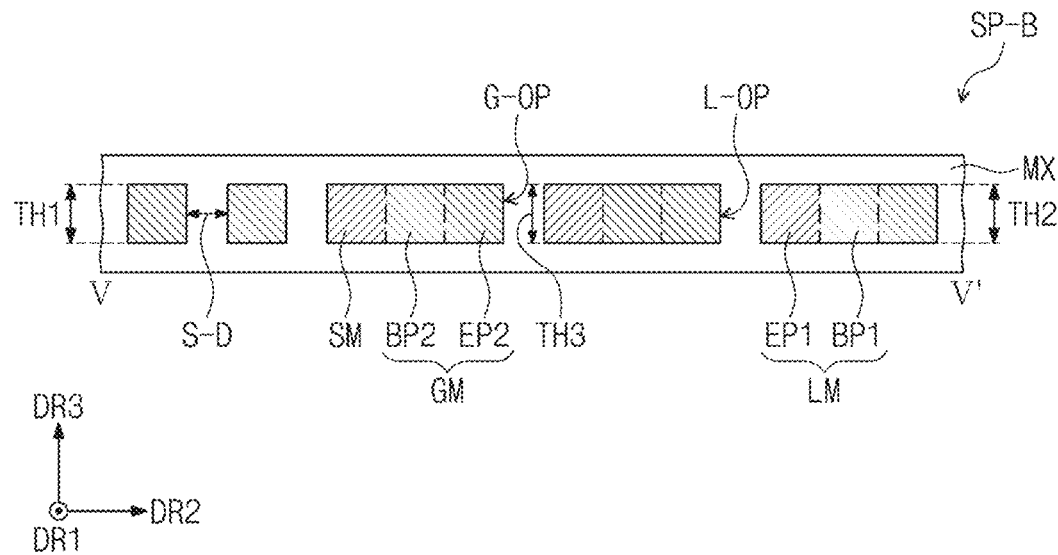
FIG. 6C is a cross-sectional view taken along line V-V' of FIG. 6B.
Figure 6D:
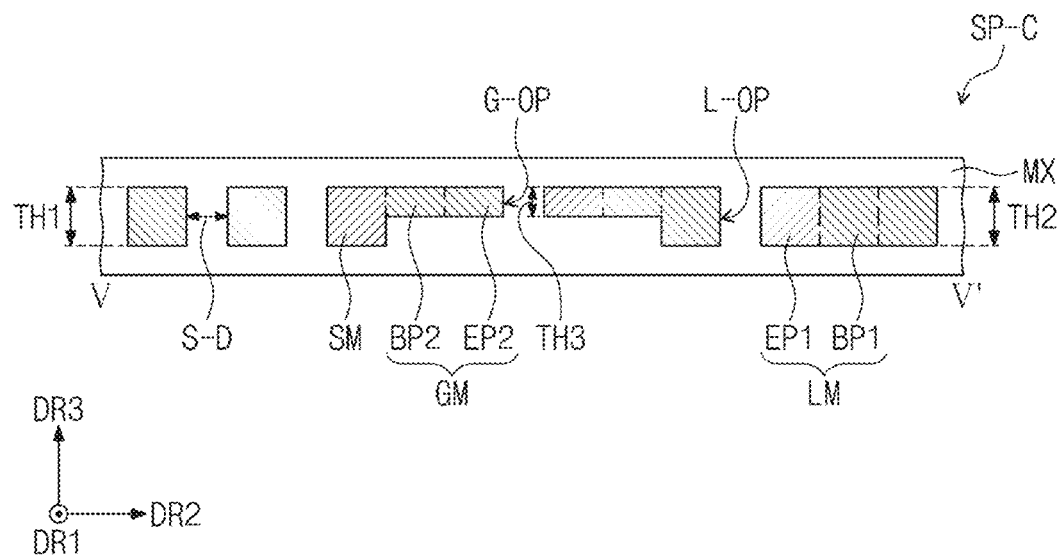
FIG. 6D is a cross-sectional view illustrating a support member according to an embodiment of the invention.

FIG. 6A is a plan view illustrating a support member according to an embodiment of the invention. FIG. 6B is a plan view illustrating a support member according to an embodiment of the invention. FIG. 6C is a cross-sectional view taken along line V-V' of FIG. 6B. FIG. 6D is a cross-sectional view illustrating a support member according to an embodiment of the invention. The same or similar components as those described above with reference to FIGS. 1A to 5D will be designated by the same or similar reference numerals, respectively, and any repetitive detailed description thereof will be omitted or simplified.

Referring to FIG. 6A, a support member SP-A according to an embodiment may include a matrix MX, a first supporter, a second supporter, and an additional supporter. The first supporter, the second supporter, and the additional supporter may be disposed in the matrix MX.

The support member SP-A may include first areas PR1, PR2, and PR3, second areas LT1, LT2, and LT3, and additional areas GT1 and GT2, which each extend in the first direction DR1 and are spaced apart from each other in the second direction DR2.

A first additional area GT1 may be disposed between a 1st first area PR1 and a 1st second area LT1, and a second additional area GT2 may be disposed between the 1st second area LT1 and a 2nd first area PR2

In an embodiment where the display module DM includes 1st to n-th first areas and 1st to n-th second areas, an additional area may be disposed on between a i-th first area and a i-th second area and between the i-th second area and a (i+1)-th first area among the 1st to n-th first area and 1st to n-th second areas.

The first supporter may be disposed in the matrix MX. The first supporter may include first extension parts SM that each extend in the first direction DR1 and are spaced apart from each other in the second direction DR2. Thus, a spaced space S-D may be defined between the first extension parts adjacent to each other in the second direction DR2.

The first supporter may overlap each of the first areas PR1, PR2, and PR3. That is, the first extension parts SM may be respectively disposed on the first areas PR1, PR2, and PR3.

The second supporter may be disposed in the matrix MX. The second supporter may include a slit LM in which openings L-OP are defined. The slit LM may include second extension parts EP1 and connection parts BP1. The second extension parts EP1 may each extend in the first direction DR1 and be spaced apart from each other in the second direction DR2. The connection parts BP1 may be disposed between the second extension parts EP1.

The second supporter may overlap each of the second areas LT1, LT2, and LT3. That is, the second extension parts EP1 and the connection parts BP1 may be disposed on each of the second areas LT1, LT2, and LT3.

The additional supporter may be disposed in the matrix MX. The additional supporter may include an additional slit GM in which additional openings G-OP are defined. The additional slit GM may include additional extension parts EP2 and additional connection parts BP2. The additional extension parts EP2 may each extend in the first direction DR1 and be spaced apart from each other in the second direction DR2. The additional connection parts BP2 may be disposed between the additional extension parts EP2.

The additional supporter may overlap each of the additional areas GT1 and GT2. That is, the additional extension parts EP2 and the additional connection parts BP2 may be disposed on each of the additional areas GT1 and GT2.

According to an embodiment, the number of the connection parts BP1 disposed between the second extension parts EP1 adjacent to each other in the second direction DR2 may be greater than the number of the additional connection parts BP2 disposed between the additional extension parts EP2 adjacent to each other in the second direction DR2.

In an embodiment where the display module DM includes 1st to n-th first areas and 1st to n-th second areas, among the connection parts BP1, the number of the connection parts disposed between a i-th second extension part and a (i+1)-th second extension part may be greater than the number of the additional connection parts disposed between a i-th additional extension part and a (i+1)-th additional extension part.

Referring to FIG. 6B, a support member SP-B according to an embodiment may include a matrix MX, a first supporter, a second supporter, and an additional supporter. The first supporter, the second supporter, and the additional supporter may be disposed in the matrix MX.

The support member SP-B may include first areas PR1, PR2, and PR3, second areas LT1, LT2, and LT3, and additional areas GT1 and GT2, which each extend in the first direction DR1 and are spaced apart from each other in the second direction DR2. { }

The first supporter may include first extension parts SM. The first supporter may overlap each of the first areas PR1, PR2, and PR3.

The second supporter may include a slit LM in which openings L-OP are defined, and the slit LM may include second extension parts EP1 and the connection parts BP1. The second supporter may overlap each of the second areas LT1, LT2, and LT3.

The additional supporter may include an additional slit GM in which additional openings G-OP are defined, and the additional slit GM may include additional extension parts EP2 and additional connection parts BP2. The additional supporter may be disposed on each of the additional areas GT1 and GT2.

Each of the connection parts BP1 according to an embodiment may have a width TE1 in the first direction DR1 less than a width TE2 in the first direction DR1 of each of the additional connection parts BP2.

Referring to FIG. 6C, each of the first extension parts SM may have a first thickness TH1, each of the second extension parts EP1 and the connection parts BP1 may have a second thickness TH2, and each of the additional extension parts BP may have a third thickness TH3.

In an embodiment, the first thickness TH1, the second thickness TH2, and the third thickness TH3 may be equal to each other. In such an embodiment, the support member SP-B may include the extension parts having a same thickness as each other and different widths from each other.

Referring to FIG. 6D, each of the first extension parts SM according to an embodiment may have a first thickness TH1, each of the second extension parts EP1 and the connection parts BP1 may have a second thickness TH2, and each of the additional extension parts EP2 and the additional connection parts BP2 may have a third thickness TH3.

In an embodiment, the first thickness TH1 and the second thickness TH2 may be equal to each other, and the third thickness TH3 may be less than each of the first thickness TH1 and the second thickness TH2.

In such an embodiment, the support member SP-A, SP-B, or SP-C includes the additional supporter disposed between the first areas PR1, PR2, and PR3 and the second areas LT1, LT2, and LT3, including the connection parts, the number of which is less than the number of the connection parts of the second supporter, having the width less than the width of the connection parts of the second supporter, or having the thickness less than the thickness of the connection parts of the second supporter, such that a connection density (or a density of supporters in the support member SP-A, SP-B, or SP-C) may be more gradually changed between the first supporter disposed on the first areas PR1, PR2, and PR3 and the second supporter disposed on the second areas LT1, LT2, and LT3. In such an embodiment, a defect due to the openings L-OP defined in the slit LM of the second supporter being recognized may be reduced.

Figure 7:
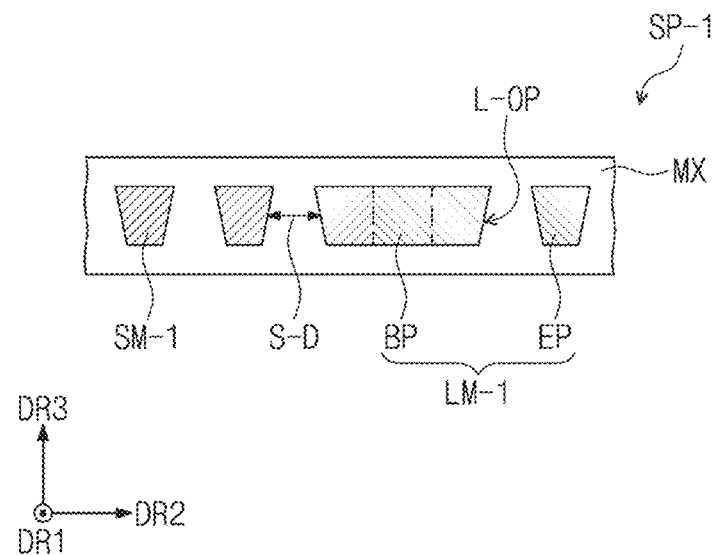
FIG. 7 is a cross-sectional view illustrating a support member according to an embodiment of the invention.
Figure 8:
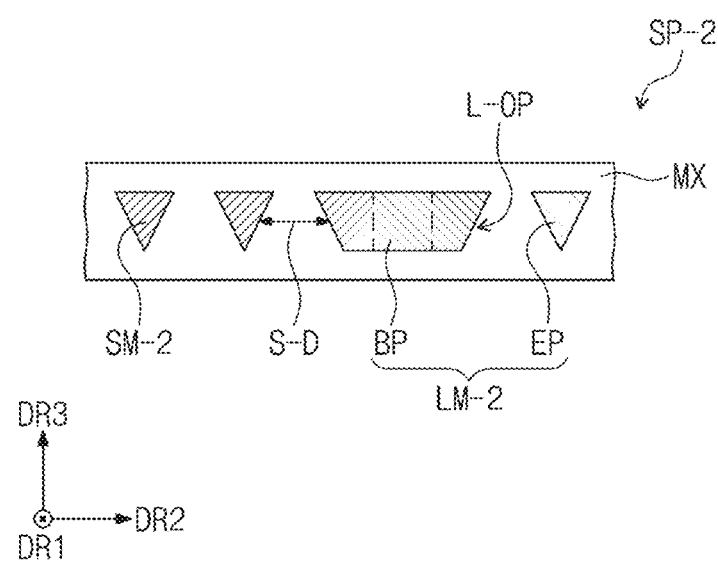
FIG. 8 is a cross-sectional view illustrating a support member according to an embodiment of the invention.

FIG. 7 is a cross-sectional view illustrating a support member according to an embodiment of the invention. FIG. 8 is a cross-sectional view illustrating a support member according to an embodiment of the invention. The same or similar components as those described above with reference to FIGS. 1A to 5D will be designated by the same or similar reference numerals, respectively, and any repetitive detailed description thereof will be omitted or simplified.

Referring to FIG. 7, a support member SP-1 according to an embodiment may include a matrix MX, a first supporter, and a second supporter. The first supporter and the second supporter may be disposed in the matrix MX.

The first supporter may include first extension parts SM-1. Thus, a spaced space S-D may be defined between the first extension parts adjacent to each other in the second direction DR2.

The second supporter may include a slit LM-1 in which openings L-OP are defined, and the slit LM-1 may include second extension parts EP and the connection parts BP.

According to an embodiment, at least one selected from the first extension parts SM-1, the second extension parts EP, and the connection parts BP may have a (reverse) trapezoidal shape on a cross-section.

Referring to FIG. 8, a support member SP-2 according to an embodiment may include a matrix MX, a first supporter, and a second supporter. The first supporter and the second supporter may be disposed in the matrix MX.

The first supporter may include first extension parts SM-2. Thus, a spaced space S-D may be defined between the first extension parts adjacent to each other in the second direction DR2.

The second supporter may include a slit LM-2 in which openings L-OP are defined, and the slit LM-2 may include second extension parts EP and the connection parts BP.

According to this embodiment, at least one selected from the first extension parts SM-2, the second extension parts EP, and the connection parts BP may have a triangular shape on a cross-section.

According to embodiments of the invention, the surface quality of a display unit of a rollable display module may be improved, and the display unit having the improved rollable property may be provided.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display module comprising:
    a display unit which displays an image; and
    a support member disposed below the display unit, wherein the support member includes 1st to n-th first areas spaced apart from each other, and 1st to n-th second areas alternately disposed with the 1st to n-th first areas,
    wherein the support member comprises:
    a matrix;
    a first supporter disposed in the matrix and comprising first extension parts each extending in a first direction and spaced apart from each other in a second direction crossing the first direction; and
    a second supporter disposed in the matrix and comprising second extension parts, each extending in the first direction and spaced apart from each other in the second direction, and connection parts disposed between the second extension parts, wherein the second extension parts and the connection parts define openings in the second supporter,
    wherein the first supporter overlaps each of the 1st to n-th first areas, and
    the second supporter overlaps each of the 1st to n-th second areas,
    wherein n is a natural number, and
    a connection density of the second supporter is greater than a connection density of the first supporter.

2. The display module of claim 1, wherein each of the 1st to n-th first areas has a width in the second direction, which gradually increases from the 1st first area to the n-th first area, and
    wherein the first supporter and the second supporter each comprises materials different from the matrix.

3. The display module of claim 1, wherein the connection parts disposed between a i-th second extension part and an (i+1)-th second extension part among the connection parts are shifted with the connection parts disposed between the (i+1)-th second extension part and an (i+2)-th second extension part in the first direction,
    wherein i is a natural number.

4. The display module of claim 1, wherein the support member further comprises:
    an additional supporter disposed in the matrix between an i-th first area and a i-th second area or between the i-th second area and an (i+1)-th first area among the 1st to n-th first areas and the 1st to n-th second areas,
    wherein the additional supporter comprises additional extension parts each extending in the first direction and spaced apart from each other in the second direction and additional connection parts disposed between the additional extension parts, wherein the additional extension parts and the additional connection parts define additional openings in the additional supporter.

5. The display module of claim 4, wherein a number of the connection parts disposed between a i-th second extension part and an (i+1)-th second extension part among the connection parts is greater than a number of the additional connection parts disposed between a i-th additional extension part and an (i+1)-th additional extension part among the additional connection parts.

6. The display module of claim 4, wherein the additional supporter has a thickness less than a thickness of each of the first supporter and the second supporter.

7. The display module of claim 4, wherein each of the additional connection parts has a width in the first direction less than a width in the first direction of each of the connection parts.

8. The display module of claim 1, wherein
    each of the openings has a width of 0.5 mm or more to 2.0 mm or less in the first direction, and
    each of the openings has a width of 0.1 mm or more to 0.5 mm or less in the second direction.

9. The display module of claim 1, wherein each of the first supporter and the second supporter has a line width of 0.5 mm or more to 2.0 mm or less.

10. The display module of claim 1, wherein a distance between centers of the first extension parts adjacent to each other in the second direction among the first extension parts is 0.5 mm or more to 2.0 mm or less.

11. The display module of claim 1, wherein
the matrix has a thickness of 0.5 mm or more to 2.0 mm or less, and
each of the first supporter and the second supporter has a thickness of 0.4 mm or more to 0.8 mm or less.

12. The display module of claim 1, wherein
the matrix comprises an elastomer, and
each of the first supporter and the second supporter comprises one of stainless steel, aluminum, and carbon fiber reinforced plastic.

13. The display module of claim 1, wherein at least a portion of each of the first extension parts and the second extension parts has a square shape, a rectangular shape, a trapezoidal shape, and a triangular shape on a cross-section.

14. The display module of claim 1, wherein each of the display unit and the support member is rolled around an imaginary axis extending in the first direction.

15. A display device comprising:
a shaft extending in a first direction; and
a display module comprising a display unit which displays an image, and a support member disposed below the display unit, wherein the support member includes a 1st to n-th first areas spaced apart from each other along a second direction crossing the first direction, and 1st to n-th second areas alternately disposed with the 1st to n-th first areas,
wherein the support member comprises: a matrix; a first supporter embedded in the matrix and comprising first extension parts spaced apart from each other; and a second supporter embedded in the matrix, wherein openings are defined in the second supporter,
wherein the first supporter overlaps each of the 1st to n-th first areas,
the second supporter overlaps each of the 1st to n-th second areas, and
each of the 1st to n-th second areas overlaps a start point of the 1st first area when the display module is rolled around the shaft,
wherein n is a natural number.

16. The display device of claim 15, wherein each of the 1st to n-th first areas has a width in the second direction, which gradually increases from the 1st first area to the n-th first area, and
wherein the first supporter and the second supporter each comprises materials different from the matrix.

17. The display device of claim 15, wherein the support member further comprises an additional supporter disposed in the matrix between a i-th first area and a i-th second area or between the i-th second area and an (i+1)-th first area among the 1st to n-th first areas and the 1st to n-th second areas,
wherein the additional supporter comprises additional extension parts, each extending in the first direction and spaced apart from each other in the second direction, and additional connection parts disposed between the additional extension parts, wherein the additional extension parts and the additional connection parts define additional openings in the additional supporter.

18. The display device of claim 17, wherein each of the additional openings has an area greater than an area of each of the openings in the second supporter.

19. The display device of claim 15, wherein
a module opening extending in the first direction is defined in the shaft,
one portion of the display module adjacent to the 1st first area is disposed in the module opening such that the display module is coupled with the shaft, and
the display module is rolled around the shaft based on the start point.

20. The display device of claim 15, wherein
an adhesive groove, in which an adhesive layer is disposed, is defined in the shaft,
a portion of the display module overlapping the 1st first area is coupled with the shaft by the adhesive layer, and
the display module is rolled around the shaft based on the start point.

* * * * *